(12) United States Patent
Kohama et al.

(10) Patent No.: US 6,536,452 B1
(45) Date of Patent: Mar. 25, 2003

(54) PROCESSING APPARATUS AND PROCESSING METHOD

(75) Inventors: Kyouji Kohama, Hachioji (JP); Eiji Shimbo, Tokyo-To (JP); Yuji Kamikawa, Koshi-Machi (JP); Takayuki Toshima, Yamanashi-Ken (JP); Hiroki Ohno, Machida (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 09/559,343

(22) Filed: Apr. 27, 2000

(30) Foreign Application Priority Data

Apr. 27, 1999 (JP) ............................................. 11-119957
Jun. 29, 1999 (JP) ............................................. 11-184191

(51) Int. Cl.7 ................................................ B08B 3/02
(52) U.S. Cl. ...................... 134/117; 134/148; 134/157; 134/183; 134/902; 134/200
(58) Field of Search .................... 134/76, 200, 84, 134/86, 117, 148, 153, 157, 183, 902

(56) References Cited

U.S. PATENT DOCUMENTS

| | | | |
|---|---|---|---|
| 1,946,360 A | * | 2/1934 | Roberts |
| 4,267,794 A | * | 5/1981 | Hartman |
| 4,300,581 A | | 11/1981 | Thompson |
| 4,362,486 A | * | 12/1982 | Davis et al. |
| 4,714,010 A | * | 12/1987 | Smart |
| 4,948,979 A | * | 8/1990 | Munakata et al. |
| 4,983,223 A | * | 1/1991 | Gessner |
| 5,022,419 A | | 6/1991 | Thompson et al. |
| 5,095,927 A | | 3/1992 | Thompson et al. |
| 5,154,199 A | | 10/1992 | Thompson et al. |
| 5,221,360 A | | 6/1993 | Thompson et al. |
| 5,381,808 A | * | 1/1995 | Kamikawa |
| 5,678,320 A | | 10/1997 | Thompson et al. |
| 5,784,797 A | | 7/1998 | Curtis et al. |
| 6,235,171 B1 | * | 5/2001 | Yamamoto |
| 6,343,239 B1 | * | 1/2002 | Toda et al. |

FOREIGN PATENT DOCUMENTS

| | | | |
|---|---|---|---|
| DE | 2355552 | * | 5/1975 |
| JP | 2-97679 | * | 4/1990 |
| JP | 4-34902 | | 8/1992 |
| JP | 6-333899 | * | 12/1994 |
| JP | 7-194969 | * | 8/1995 |
| JP | 2000-277489 | * | 10/2000 |

* cited by examiner

Primary Examiner—Frankie L. Stinson
(74) Attorney, Agent, or Firm—Smith, Gambrell & Russell, LLP

(57) ABSTRACT

A processing apparatus essentially includes a rotatable rotor 21 for carrying semiconductor wafers W, a motor 22 for driving to rotate the rotor 21, a plurality of processing chambers for surrounding the wafers W carried by the rotor 21, for example, an inner chamber 23 and an outer chamber 24, a chemical supplying unit 50, an IPA supplying unit 60, a rinse supplying unit 70 and a drying fluid supplying unit 80. With this constitution of the apparatus, it is possible to prevent the wafers from being contaminated due to the reaction of treatment liquids of different kinds, with the improvement of processing efficiency and miniaturization of the apparatus.

30 Claims, 21 Drawing Sheets

PROCESSING APPARATUS AND PROCESSING METHOD

BACKGROUND OF THE INVENTION

1. Technical Field of the Invention

The present invention relates to a processing apparatus and a processing method for applying a designated treatment on a substrate, such as semiconductor wafer, by supplying a treatment liquid to the substrate.

2. Description of the Related Art

Generally, in the manufacturing field for semiconductor devices, there are various cleaning apparatuses which clean semiconductor wafers, which will be referred to "wafers" hereinafter, by designated cleaning liquids in order to remove various contamination, for example, particles, organic contaminants, metal impurities, etc. adhering to surfaces of the wafers. Among those apparatuses, there is a widely-used cleaning apparatus which can remove the particles etc. from a plurality of wafers by cleaning them on use of the cleaning liquids. In this apparatus, the wafers are accommodated in a cleaning bath into which the cleaning liquids are supplied.

As the conventional cleaning and drying apparatus of this kind, there is known a cleaning and drying apparatus which includes: one processing chamber provided, on one side thereof, with an opening for loading/unloading the wafers etc. and a door for closing the above opening; a rotor arranged in the chamber to rotate a carrier accommodating the wafers etc. slanted to the horizontal axis; liquid supply means for supplying liquid to the wafers etc.; and gas supply means for supplying gas to the wafers etc. (see U.S. Pat. No. 4,300,581) In connection, there is also known an apparatus which includes a detachable processing chamber for maintenance. (see U.S. Pat. No. 5,221,360) Further, this cleaning and drying apparatus has a structure where a motor and nozzles are attached to an attachment plate together with the above processing chamber. (see U.S. Pat. No. 5,022,419) There is also a cleaning and drying apparatus provided, in a drain/exhaust line in communication with a processing chamber, with gas-liquid separating means which separates the processing liquid into liquid and gas for discharge. (see U.S. Pat. No. 5,095,927) In connection, there is also known a structure where the gas-liquid separating means is equipped with a sensor. (see U.S. Pat. No. 5,154,199) In the cleaning and drying apparatus, upon closing the processing chamber in which a cassette accommodating the plural wafers etc. are carried in a rotor, it is carried out to rotate the rotor and the wafers while supplying cleaning liquid to the wafers etc. After completing the cleaning process, dry gas is supplied against the wafers etc. rotating together with the rotor, in the drying process. In the modification, there is an apparatus which directly loads the wafers etc. through its front face without using such a cassette. (see U.S. Pat. Nos. 5,678,320 and 5,784,797)

As another processing apparatus, a single wafer spinning apparatus is also provided with a plurality of processing chambers (cups) opening their upsides. (Japanese Examined Utility Model Publication kokoku No. 4-34902)

In the above-mentioned cleaning and drying apparatuses, however, there are problems of not only hindrance but atmospheric disturbance in drying process due to the residual cleaning liquid used in the cleaning process since both cleaning process and sequent drying process are carried out in the single processing chamber. Of course, these problems arise in case of using one kind of cleaning liquid. Particularly in case of performing the cleaning process while using different kinds of processing liquids, for example, chemicals of resist stripper and polymer remover, solvent of these chemicals (e.g. IPA: isopropyl alcohol), processing liquid of rinsing liquid (e.g. pure water) etc.; the cleaning/drying process while using processing fluid, such as dry gas (inert gas (e.g. $N_2$ gas) and fresh air); or the cleaning process while supplying an acid cleaning liquid (e.g. SPM), pure water, alkaline cleaning liquid (e.g. APM) in order, then such different kinds of chemicals would react with each other, causing the cross-contamination against the wafers etc.

In order to solve the above problem, it might be supposed to use different processing chambers in accordance with different kinds of processing liquids. However, such a measure would cause the processing efficiency to be deteriorated and additionally, the excessive requirement of footprint may cause the apparatus itself to be large-sized.

Note, although the above-mentioned single wafer spinning apparatus disclosed in Japanese Examined Utility Model Publication kokoku No. 4-34902 can somewhat prevent the processing liquids, such as chemicals of different kinds, from reacting with each other because of several processing chambers (cups), there is a problem of imperfectly preventing the wafers etc. from being contaminated since the cups are opened upward.

SUMMARY OF THE INVENTION

Accordingly, it is therefore an object of the present invention to provide a processing apparatus and a processing method, by which it is possible to prevent the objects from being contaminated due to the reaction of treatment liquids of different kinds and also possible to realize the improvement in processing efficiency and the miniaturization of the apparatus.

The first feature of the invention resides in that the processing apparatus comprises a plurality of containers movably arranged so as to occupy both a surrounding position to surround at least one object to be processed and a stand-by position not to surround the object, moving means for moving a designated container of the containers thereby to position the designated container in the surrounding position, and processing means for applying a designated process on the object in the surrounding position.

Therefore, when applying the designated process by using a plurality of processing fluids, it is possible to move different processing chambers to the periphery of the object in accordance with the kinds of processing fluids. Thus, even if the respective processing fluids are remained in the respective processing chambers, there is no possibility of different processing fluid in the identical chamber. Accordingly, it is possible to prevent the object from being contaminated by the reaction of different processing fluids.

The second feature of the invention resides in that the plural containers are arranged while engaging each other and also adapted so as to be individually movable to the object, and when applying the designated process on the object in the designated container of the plural containers, then the moving means moves the other container inside the designated container to the stand-by position.

In this case, it is possible to move the plural containers between the surrounding position and the stand-by position with ease and also possible to accommodate the containers compactly. Thus, the whole processing apparatus can be small-sized.

The third feature of the invention resides in that the processing apparatus comprises a pair of first and second walls arranged so as to oppose each other and also separated from each other; a carrier provided on the first wall, for carrying at least one object between the first wall and the second wall; and a plurality of peripheral walls each extending from the first wall to the second wall thereby to define a processing space for processing the object together with the first and second walls; wherein the plural peripheral walls are overlapped while being mutually inserted in each other and are individually adapted so as to be movable between a surrounding position to define the processing space together with the first and second walls and a stand-by position where no object is surround; moving means for moving a designated peripheral wall of the plural peripheral walls thereby to position the designated peripheral in the surrounding position while moving another peripheral wall inside the designated peripheral wall thereby to position the other peripheral wall in the stand-by position; and processing means for applying a designated process on the object in the surrounding position.

Therefore, when applying the designated process by using a plurality of processing fluids, it is possible to move different processing chambers to the periphery of the object in accordance with the kinds of processing fluids. Thus, even if the respective processing fluids are remained in the respective processing chambers, there is no possibility of different processing fluid in the identical chamber. Accordingly, it is possible to prevent the object from being contaminated by the reaction of different processing fluids.

Additionally, it is possible to accommodate the plural containers compactly, whereby the whole processing apparatus can be small-sized.

The fourth feature of the invention resides in that the peripheral walls are in the form of cylinders.

The fifth feature of the invention resides in that the peripheral walls are adapted so as to be movable between the surrounding position and the stand-by position in a direction between the first wall and the second wall.

The sixth feature of the invention resides in that each of the containers is provided, at an interior thereof, with a processing fluid supplying port which can supply a processing fluid for applying a designated process on the object.

In this case, it is possible to supply the processing fluids corresponding to the peripheral walls respectively, whereby the mixing of different fluids can be prevented.

The seventh feature of the invention resides in that the processing fluid is either liquid or gas. Accordingly, it is possible to perform not only chemical treatment but drying, accomplishing a series of processes in the identical apparatus continuously.

The eighth feature of the invention resides in that each of the containers is provided with a discharge port for discharging the processing fluid provided for processing the object. Accordingly, it is possible to discharge the respective processing fluids corresponding to the respective peripheral walls independently, whereby the presence of different fluids in the identical container can be prevented.

The ninth feature of the invention resides in that respective outer profiles of the containers are tapered in a manner that their local diameters gradually increase as approaching the discharging port. Thus, it is possible to introduce the processing fluids in the containers and those sticking to the inner walls of the containers into the discharge ports effectively. Especially, since the processing fluid is led to the discharge port by revolving streams resulting from the rotation of the object, it is possible to realize the effective discharging.

The $10^{th}$. feature of the invention resides in that the carrier is provided with a diving unit for rotating the object. Thus, it is possible to make the contact of the processing fluid with the object promptly. Additionally, it is possible to blow the used processing fluid off the object for drain, improving the processing efficiency of the apparatus.

The $11^{th}$. feature of the invention resides in that the object is carried in the carrier so that the object's surface is along an up and down direction and the object is rotated by the driving unit so that a rotating axis extends in the horizontal direction of the processing apparatus. In this case, it is possible to remove the processing fluid sticking to the object's surface with ease.

The $12^{th}$. feature of the invention resides in that the objects of the plural number are juxtaposed along the rotating axis and the processing fluid supplying port has nozzle orifices whose number is equal to or larger than the number of the objects. That is, since the identical processing fluid is supplied for the plural objects, the treatment for the objects can be equalized.

The $13^{th}$. feature of the invention resides in that the containers are capable of surrounding the object so as to be sealed in the containers.

The $14^{th}$. feature of the invention resides in that the containers are capable of insulating their inside atmospheres from their outside atmospheres even when the containers are in the stand-by positions.

The $15^{th}$. feature of the invention resides in that at least one container of the containers is capable of insulating its inside atmosphere from their outside atmospheres of the other containers.

The $16^{th}$. feature of the invention resides in that the second wall is positioned above the first wall and the peripheral walls are arranged so that their axes extend up and down. Then, it is possible to store the liquid inside the outer peripheral wall, allowing the object to be immersed in the liquid.

The $17^{th}$. feature of the invention resides in that the peripheral walls and the first wall are constructed so as to allow liquid to be stored in a space defined by the peripheral walls and the first wall. In this case, it is possible to make a sufficient contact of chemicals, cleaning liquid, etc. with the object, accomplishing the appropriate reaction and sequent cleaning.

The $18^{th}$. feature of the invention resides in that the second wall is provided with a lid which can open and close in order to load the object into the processing apparatus and unload the object therefrom. Accordingly, the object can be loaded and unloaded through the upper part of the container.

The $19^{th}$. feature of the invention resides in that the processing apparatus comprises a fixed container being fixedly positioned at a surrounding position in which the fixed container surrounds an object to be processed; and one or more movable containers being movable and positioned between a surrounding position in which the movable container surround the object and a stand-by position in which the movable container does not surround the object; wherein said one or more movable containers are positioned at the stand-by position when the object is processed in such a state that the fixed container surrounds the object.

Then, it is possible to improve the durability of the fixed container and also eliminate a driving unit for the fixed container.

The $20^{th}$. feature of the invention resides in that a processing method of processing at least one object to be processed by using a processing apparatus including one or more containers movably arranged so as to occupy both a surrounding position to surround the object and a stand-by position where no object is surrounded, the method comprising the steps of:

positioning a designated container of the containers in the surrounding position to apply a designated process on the object;

moving the designated container to the stand-by position; and positioning the other container of the containers in the surrounding position to apply the designated process on the object.

Also in this case, when applying the designated process by using a plurality of processing fluids, it is possible to move different processing chambers to the periphery of the object in accordance with the kinds of processing fluids. Thus, even if the respective processing fluids are remained in the respective processing chambers, there is no possibility of different processing fluid in the identical chamber. Accordingly, it is possible to prevent the object from being contaminated by the reaction of different processing fluids.

The $21^{st}$. feature of the invention resides in that the processing apparatus includes a holder for holding the object, the plural containers being arranged while engaging each other, when positioning the designated container of the plural containers to the surrounding position, the object is subjected to the designated process while positioning the other container existing inside the designated container in the stand-by position.

In this case, it is possible to move the plural containers between the surrounding position and the stand-by position with ease and also possible to accommodate the containers compactly. Thus, the whole processing apparatus can be small-sized.

The $22^{nd}$. feature of the invention resides in that the designated process for the object is to inject a treatment liquid against the object in the designated container. Then, it is possible to make an effective contact of the treatment liquid with the object.

The $23^{rd}$. feature of the invention resides in that the object is rotated during the designated process. Owing to the rotation, it is possible to perform the contact of the supplied treatment liquid with the object and the removal of the used treatment liquid promptly.

The $24^{th}$. feature of the invention resides in that the designated process for the objects comprises a chemical treatment process to supply a chemical to the objects in a first container and a drying process to supply drying fluid to the objects in a second container. Then, the chemical treatment and drying processes can be carried out as one continuous process, realizing the improved efficiency in processing.

The $25^{th}$. feature of the invention resides in that the designated process for the objects comprises a chemical treatment process to supply a chemical to the objects in the designated container in the surrounding position and a sequent chemical removing process to supply solvent for the chemical to the objects. Accordingly, it is possible to remove the chemicals remained in the container certainly and also possible to execute two processes in the identical container, improving the process efficiency.

The $26^{th}$. feature of the invention resides in that the designated process for the objects comprises a step of applying a treatment on the objects in the inside container and a sequent step of applying another treatment on the objects in the outside container. That is, even if the treatment liquid leaks out of the inside container, the outside container can receive the so-leaked liquid. Therefore, it is possible to prevent the liquid from leaking to the outside of the apparatus, preventing the contamination of outside atmosphere.

The $27^{th}$. feature of the invention resides in that the designated process for the objects comprises a step of storing a processing liquid in the designated container and a sequent step of immersing the objects in the processing liquid. In this case, it is possible to make a sufficient contact of the chemical, cleaning liquid, etc. with the object thereby accomplishing the sufficient reaction and sequent cleaning process.

The $28^{th}$. feature of the invention resides in that the designated process for the objects further comprises a step of ejecting a processing fluid to the objects in the designated container. Accordingly, it is possible to perform not only immersing process but showering process thereby accomplishing a variety of processes.

The above and other features and advantages of this invention will become apparent, and the invention itself will best be understood, from a study of the following description and appended claims, with reference had to the attached drawings showing preferred embodiments of the invention.

DESCRIPTION OF THE PREFERRED EMBODIMENT

Preferred embodiments of the present invention will be described with reference to FIGS. 1 to 22.

Figure 1:
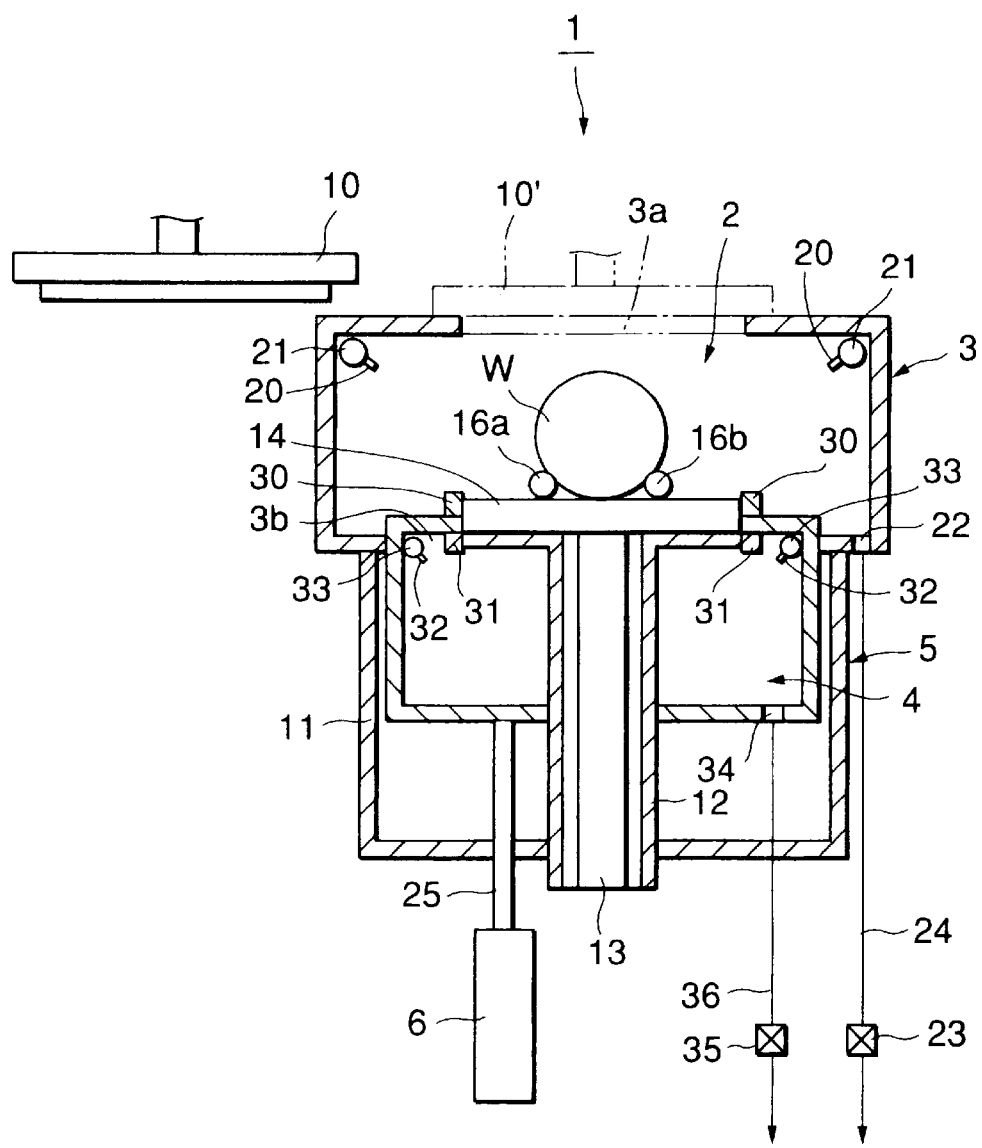
FIG. 1 is a full sectional view showing the interior structure of the cleaning apparatus in accordance with an embodiment of the present invention.

FIG. 1 shows the first embodiment of the present invention.

For explanation of the embodiment, the figure also shows the interior structure of a cleaning apparatus 1, viewed from its front side. As shown in FIG. 1, the cleaning apparatus 1 comprises an outer cleaning bath 3, an inner cleaning bath 5 and an elevating mechanism 6. In detail, the outer cleaning bath 3 has an outer cleaning chamber 2 capable of surrounding twenty-five (25) pieces of wafers W with room. Note, the outer cleaning chamber 2 may be called "the first cleaning chamber" in this specification. The inner cleaning bath 5 has an inner cleaning chamber 4 which is constructed so as to enter and leave the outer cleaning chamber 2 and also capable of surrounding the wafers W existing in the outer cleaning chamber 2. Similarly, the inner cleaning chamber 4 may be called "the second cleaning chamber". The elevating mechanism 6 can realize two conditions of the apparatus 1 as follows: a condition where the inner cleaning bath 5 is moved into the outer cleaning bath 3 so that the wafers W are surrounded by the inner cleaning chamber 4 and another condition where the inner cleaning chamber 5 is withdrawn from the outer cleaning chamber 3 so that the wafers W are surrounded by the outer cleaning chamber 2.

For example, in order to remove the inorganic contaminants (e.g. metallic impurities) from the respective surfaces of the wafers W, the so-constructed cleaning apparatus 1 does perform a cleaning operation comprising a "SPM" cleaning process, a rinsing process using pure water, a "SCI" cleaning, another rinsing process using pure water and a drying process in order.

The SPM cleaning process is executed in the inner cleaning bath 5. In the SPM cleaning process, there is used a cleaning liquid called "SPM (mixture of $H_2SO_4/H_2O_2$)" of essential sulfuric acid components.

While, the SCI cleaning process is executed in the outer cleaning bath 3. In the SCI cleaning, there is used another cleaning liquid called "APM (mixture of $NH_4OH/H_2O_2/H_2O$) of essential ammonia components. The drying process is executed in the outer cleaning bath 3. In the drying process, the mixed dry gas of IPA (isopropyl alcohol) vapor and heated $N_2$ gas is supplied into the outer cleaning bath 3.

The outer cleaning bath 3 is provided, in its upper wall, with an opening 3a. In operation, the wafers W are loaded into the cleaning apparatus 1 via the opening 3a and also discharged from the apparatus 1 via the opening 3a. The opening 3a can be opened or closed by a movable lid 10. The lid 10 is constructed so as to be movable both vertically and horizontally to the outer cleaning bath 3. In FIG. 1, the lid 10 of solid line illustrates one operation to open the upper opening 3a, while the lid body 10' of double-dotted line illustrates another operation to close the opening 3a. A casing 11 is fixed on the lower wall of the outer cleaning bath 3. Disposed in the casing 11 in the figure is the inner cleaning bath 5 which is taking shelter from the outer cleaning bath 3 downward. An opening 3b is also formed in the lower wall of the outer cleaning bath 3. In the shown example, the inner cleaning bath 5 is adapted so as to pass through the opening 3b upward and downward. The cleaning apparatus 1 further includes a cylinder 12. The cylinder 12 penetrates the casing 11 and the interior center of the inner cleaning bath 5 to reach up to the lower center of the outer cleaning bath 3. Disposed in the cylinder 12 is a support shaft 13 which has its upper end connected to a table 14.

Figure 2:
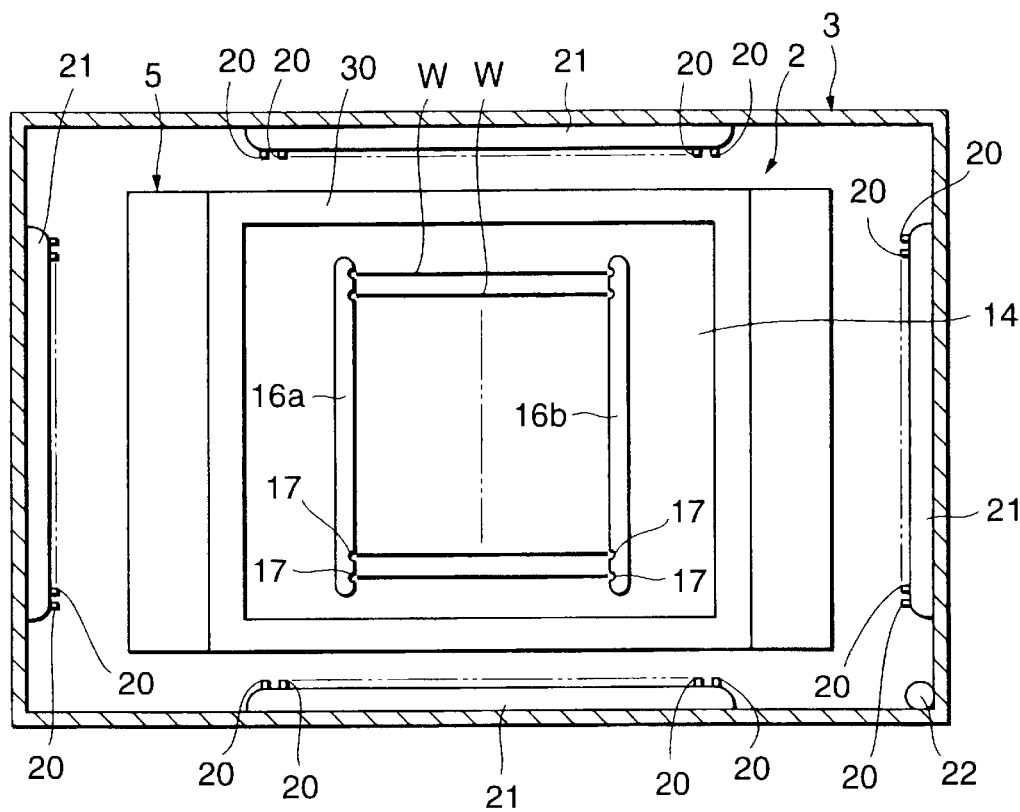
FIG. 2 is a plan sectional view showing the interior structure of an outer cleaning bath installed in the cleaning apparatus of FIG. 1.
Figure 3:
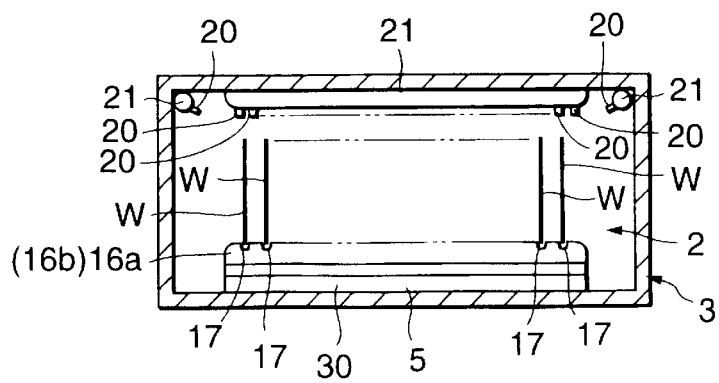
FIG. 3 is a side sectional view showing the interior structure of the outer cleaning bath installed in the cleaning apparatus of FIG. 1.

FIG. 2 shows the top view of the interior structure of the outer cleaning bath 3. FIG. 3 shows the side view of the outer cleaning bath 3, in one direction different from FIG. 1. As shown in FIGS. 2 and 3, a pair of left and right holders 16a, 16b are provided on a top surface of a table 14. Each holder 16a (16b) is provided, on its periphery, with a plurality (e.g. 25 pcs.) of grooves 17 into which the peripheries of the wafers W are to be inserted. Thus, when loading 25 pcs. of wafers W into the cleaning apparatus 1, the peripheries of the wafers W are respectively inserted into the grooves 17 of both holders 16a, 16b. Consequently, the wafers W can be accommodated in the outer cleaning chamber 2 in their upright conditions. About the upside of the outer cleaning chamber 2, there are provided four horizontal injectors (nozzles) 21 each of which has a number of injecting orifices 20 for ejecting the cleaning liquids (i.e. APM and pure water). Therefore, when cleaning the wafers W in the outer cleaning bath 3, the wafers W are first set in respective positions on the table 14 and next, the cleaning liquids are ejected from the upside of the wafers W thereby to clean their surfaces of twenty-five wafers W uniformly. Note, the orifices 20 are constructed so as to spray the chemical liquids against the wafers W. As shown in FIG. 1, the outer cleaning bath 3 is provided, on its bottom, with a drain port 22 to which a drain tube 24 equipped with a closing valve 23 is connected. The opening of the valve 23 allows the chemical liquids (APM and pure water) in the outer cleaning chamber 2 to be discharged outside. Note, in the modification, the outer cleaning bath 3 may be provided, on the periphery of the bottom, with a plurality of drain ports through which the chemical liquid is collected and discharged outside.

Figure 4:
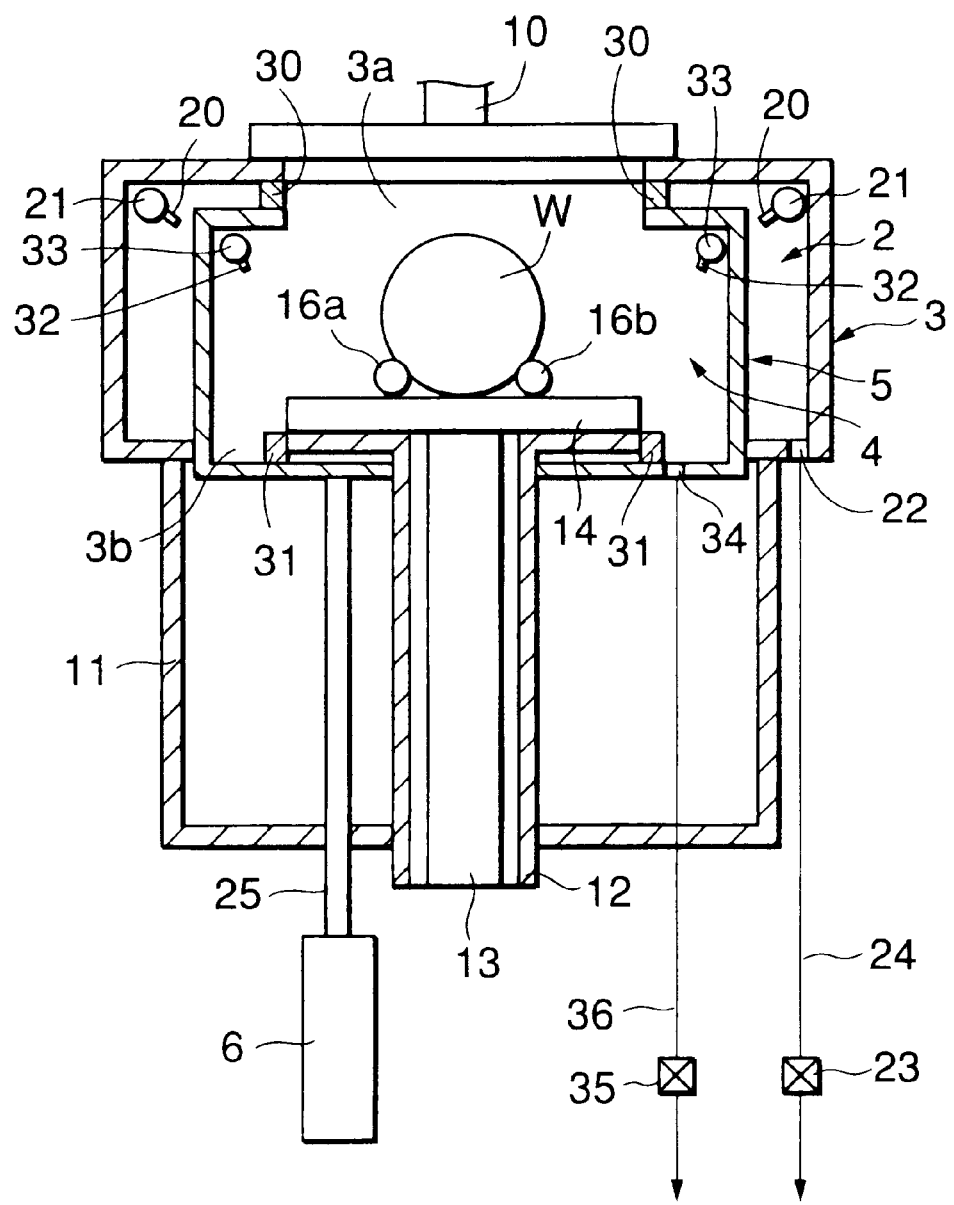
FIG. 4 is a full sectional view showing the interior structure of the cleaning apparatus of FIG. 1 on condition that an inner cleaning bath enters into the outer cleaning bath.
Figure 5:
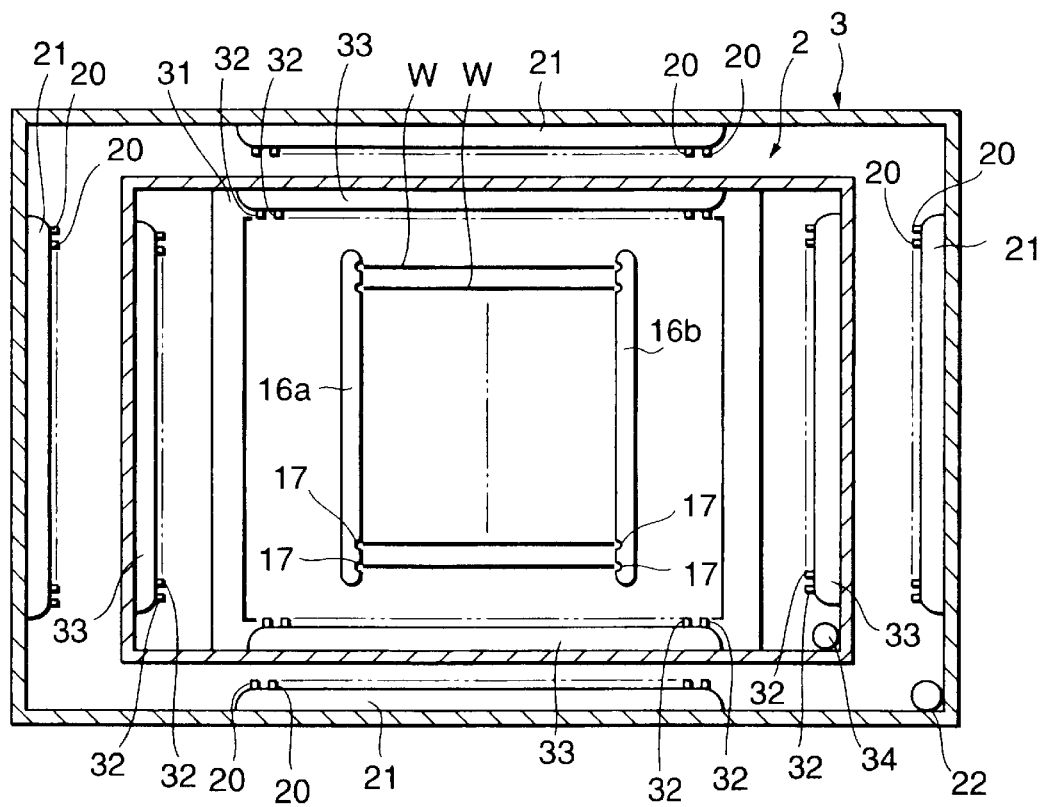
FIG. 5 is a plan sectional view showing the interior structure of the outer cleaning bath installed in the cleaning apparatus of FIG. 1 on condition that the inner cleaning bath enters into the outer cleaning bath.

In the elevating mechanism 6, an elevating shaft is connected on the lowermost face of the inner cleaning bath 5. Thus, the elevating mechanism 6 is constituted by a cylinder unit, a motor or the like. Owing to the vertical operation of the elevating mechanism 6, the inner cleaning bath 5 can move upward to enter into the outer cleaning bath 3 and also move downward to retreat from the outer cleaning bath 3, via the lower opening 3b of the outer cleaning bath 5. In detail, by making the inner cleaning bath 5 enter into the outer cleaning bath 3 as shown in FIG. 4, it is possible to attain the displacement of the inner cleaning chamber 4 for the surroundings of the wafers W, so that the wafers W can be accommodated in the inner cleaning chamber 4. FIG. 5 shows such a situation of the interior structure of the outer cleaning bath 3, viewed from the top side. While, when retreating the inner cleaning bath 5 out of the outer cleaning bath 3 by operating the elevating mechanism 6, there can be attained a situation of FIG. 1 where the wafers W are accommodated in the outer cleaning bath 2.

As shown in FIG. 4, when the inner cleaning bath 5 enters into the outer cleaning bath 5, a sealing part 30 on the top face of the inner cleaning bath 5 comes into close contact with a ceiling face of the outer cleaning chamber 2. Simultaneously, another sealing part 31 on the periphery of the top end of the cylinder 12 also comes into close contact with the bottom face of the inner cleaning bath 5. In this way, the atmosphere in the inner cleaning chamber 4 can be prevented from leaking out to the outer cleaning chamber 2. Around the upside of the inner cleaning chamber 4, there are four horizontal nozzles 33 each of which has a number of injecting orifices 32 for ejecting the chemical liquids (SPM, pure water) against the wafers W from the upside, as similar to the nozzles 21. Further, the inner cleaning bath 5 is provided, on its bottom, with a drain port 34 to which a drain tube 36 interposing a closing valve 35 is connected.

Figure 6:
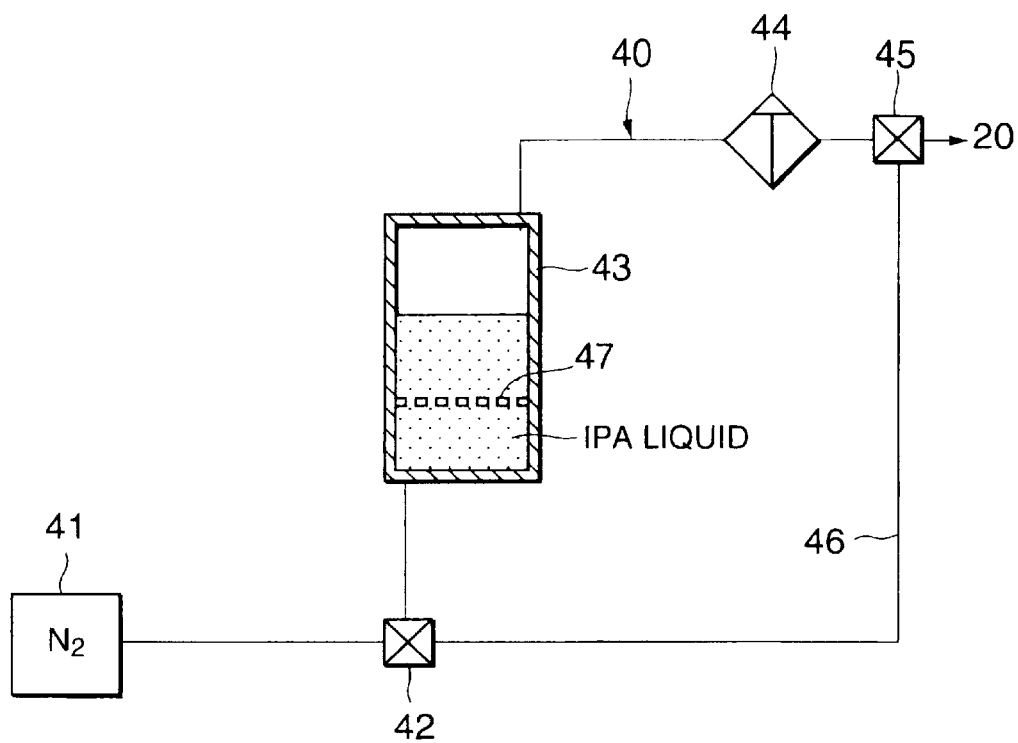
FIG. 6 is a circuit diagram of a dry gas supplying circuit.

As shown in FIG. 6, the nozzles 21 (only one shown) are also connected to the outlet of a dry-gas supplying line 40 which supplies the mixture gas of IPA vapor and heated $N_2$ gas, into the outer cleaning chamber 2 (FIG. 1). While, the inlet of the dry-gas supplying line 40 is connected to a $N_2$-source 41. Between the inlet and the outlet of the line 40, there are interposed various elements: a three-directional valve 42, a bubbling unit 43 storing IPA liquid, a filter 44 which allows gas only to pass through and a three-directional valve 45 which determines whether to feed the dry gas to the nozzles 21 or not. Further, a connecting line 46 is provided for the connection between the three-directional valve 42 and the three-directional valve 45. Owing to the switching operation of the three-directional valve 42, the heated $N_2$ gas is fed from the $N_2$-source 41 into the bubbling unit 43 at flow rate of 100–200 liter/min., thereby realizing a high-bubbling condition in the bubbling unit 43. In the unit 43, the $N_2$ gas is changed to fine bubbles by a mesh plate 47 in the unit 43, so that the evaporation of IPA liquid is facilitated.

After both IPA vapor and heated N2 gas are produced to flow out of the bubbling unit 43, moisture components are removed by a filter 44 and thereafter, they are fed to the nozzles 21 through the intermediary of the three-directional valve 45 on its switching operation. Alternatively, the only heated N2 gas may be fed by manipulating the three-directional valves 42, 54. Although the above-mentioned embodiment of the invention has been described by an example to supply the mixture of IPA vapor and heated N2 gas (or heated N2 gas only), it will be understood that there is also a case of supplying the IPA liquid to the wafers W in accordance with the kinds of drying process.

Now, we describe the cleaning operation for the wafers W executed in the cleaning apparatus 1 constructed above. For example, in order to remove the inorganic contaminants, such as metal impurities, from the surfaces of the wafers W effectively, the cleaning apparatus 1 performs the cleaning operation in the following order: the SPM cleaning process, the rinsing process, the SCI cleaning process, the rinsing process and the drying process.

As shown in FIG. 1, it is executed by a not-shown transfer arm to load the wafers W (not cleaned: 25 pcs.) into the outer cleaning bath 3 through the upper opening 3a under condition that the inner cleaning bath 5 has been retreat from the inside of the outer cleaning bath 3 by the elevating mechanism 6. In the outer cleaning bath 3, the peripheries of the wafers W are inserted into the grooves 17 of the holders 16a, 16b. Once the wafers W are accommodated in the outer cleaning chamber 2 in their upright postures, then the lid 10 moves to close the upper opening 3a of the outer cleaning bath 3.

Meanwhile, it should be noted that the chemical SPM (mixture of H2SO4/H2O2) used in the SPM cleaning is one acid cleaning liquid, while the chemical APM (mixture of NH4OH/H2O2/H2O) used in the SCI cleaning is one alkaline liquid. Therefore, in the above cleaning process, it is important to prevent the occurrence of cross-contamination (e.g. salts) due to the reaction of SPM and APM chemicals.

According to the cleaning apparatus 1 of the embodiment, when performing the designated cleaning process on use of the chemical SPM, pure water and the chemical APM, the elevating mechanism 6 operates to move the inner cleaning chamber 4 to the periphery of the wafers W corresponding to the kinds of cleaning liquids. Then, when supplying the chemical SPM and pure water to the wafers W, it is executed to accommodate the wafers W in the inner cleaning chamber 4, thereby performing the SPM cleaning and the sequent rinsing. On the other hand, when supplying the chemical APM and pure water to the wafers W, it is executed to accommodate the wafers W in the outer cleaning chamber 2, thereby performing the SCI cleaning and the drying. Therefore, even if the chemical SPM remains in the inner cleaning chamber 4 and the chemical APM remains in the outer cleaning chamber 2, these chemicals SPM, APM do not exist in the identical bath simultaneously. Because the cleaning chambers accommodating the wafers W are altered whenever the use of the chemicals SPM, APM is switched. Accordingly, it is possible to prevent the occurrence of cross-contamination, such as salts.

In detail, when performing the SPM cleaning in the outer cleaning chamber 2 at first, the elevating mechanism 6 allows the inner cleaning bath 5 to enter into the outer cleaning bath 3, as shown in FIG. 4. Thus, the inner cleaning chamber 4 is moved to the periphery of the wafers W, thereby realizing a condition to accommodate the wafers W in the inner cleaning chamber 4. Under this situation, it is executed to inject the chemical SPM to the respective surfaces of 25 pcs. of wafers W through the orifices 32. In this way, the SPM cleaning is executed in order to remove the particles from the surfaces of the wafers W. After completing the SPM cleaning, the pure water for the rinsing is supplied to the wafers W through the orifices 32 to make the wafers W clean with the perfect removal of the chemical SPM.

As shown in FIG. 1, when sequentially performing the SCI cleaning in the outer cleaning bath 3, the elevating mechanism 6 allows the inner cleaning bath 5 to leave the outer cleaning bath 3, thereby realizing a condition to accommodate the wafers W in the outer cleaning chamber 2. Similarly to the SPM cleaning, it is executed to inject the chemical APM to the respective surfaces of the wafers W through the orifices 20 in order to remove the particles and the inorganic contaminants (e.g. metallic substances), from the surfaces of the wafers W. After completing the SCI cleaning, the pure water for rinsing is supplied to the wafers W through the orifices 20 in order to make the wafers W clean with the perfect removal of the chemical APM. In this way, it is possible to supply the different kinds of chemicals SPM, APM to the inner cleaning chamber 4 and the outer cleaning chamber 2, respectively.

At last, the dry gas is ejected from the orifices 20 to dry the wafers W As shown in FIG. 6, it is first executed to supply the heated $N_2$ gas into the bubbling unit 43 storing the IPA. liquid in order to produce the mixture of IPA vapor and heated $N_2$ gas. As the dry gas, the resultant mixture is fed to the nozzles 21 through the dry-gas supplying line 40. Owing to the supply of $N_2$ gas, the drying process can be accomplished under the inert atmosphere. Furthermore, the supply of IPA vapor for the wafers' surfaces allows the residual waterdrops on the wafers W to be replaced, so that the pure water can be removed from the wafers' surfaces effectively. Thus, owing to the supply of the mixture of IPA vapor and heated $N_2$ gas into the outer cleaning chamber 2, the drying of the wafers W can be accelerated thereby to prevent the occurrence of water-marks at the drying process, for example. Accordingly, it is possible to perform short and appropriate drying process in comparison with the natural drying. After completing the designated drying process in the above way, the upper opening 3a is opened to allow the wafers W to be discharged from the cleaning apparatus 1. Note, besides the above-mentioned drying method, there may be a process to supply the only heated $N_2$ gas to the wafers W on completion of the supply of the mixture of IPA vapor and heated $N_2$ gas, a process to supply heated $N_2$ gas alone to the wafers W on completion of the supply of IPA liquid, etc.

In this way, according to the cleaning apparatus 1 of the embodiment, since the inner cleaning chamber 4 is moved in relation to the interior of the outer cleaning bath 3 for the cleaning operation of the wafers W while using both chemicals of acid SPM and alkaline APM, it is possible to realize different cleaning conditions where the wafers W are accommodated in the different cleaning chambers. Therefore, even if the chemical SPM remains in the inner cleaning chamber 4 as well as the chemical APM does in the outer cleaning chamber 2, there is no possibility of the reaction between the chemicals SPM and APM to prevent the occurrence of cross-contamination, such as salts.

Figure 7:
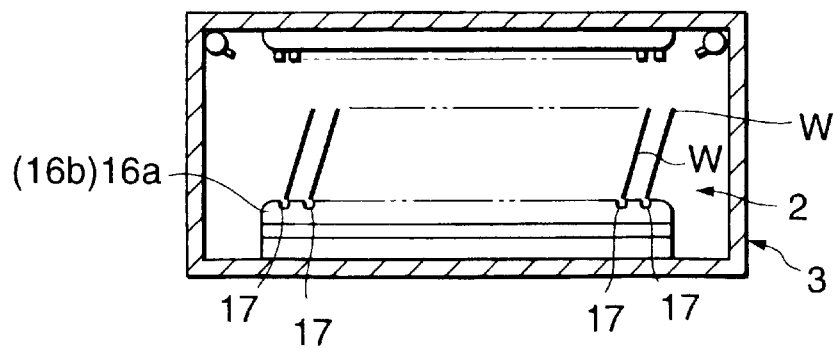
FIG. 7 is a side sectional view showing the interior structure of the outer cleaning bath installed in the cleaning apparatus of FIG. 1 on condition of accommodating the slanted wafers in the outer cleaning chamber.

Note, the wafers W in the upright condition are accommodated in the outer cleaning chamber 2 in the above-mentioned embodiment. In a variation, as shown in FIG. 7, the wafer W may be accommodated in the outer cleaning chamber 2 in their slanting conditions. Also in this case, with the above-mentioned arrangement of the invention, it is possible to wash the wafers W of 25 pcs. uniformly.

Figure 8:
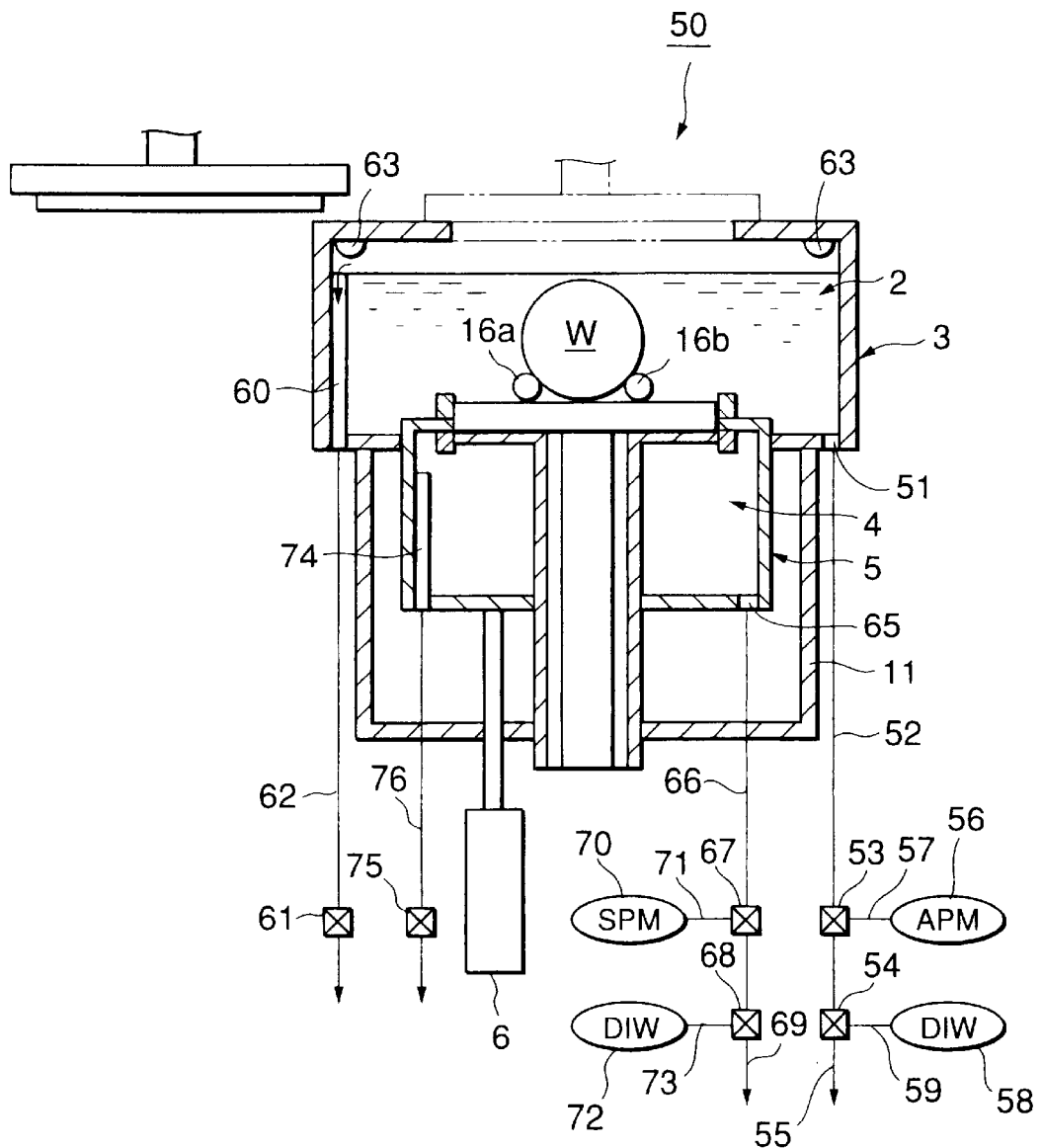
FIG. 8 is a full sectional view showing the interior structure of the cleaning apparatus of the second embodiment.
Figure 9:
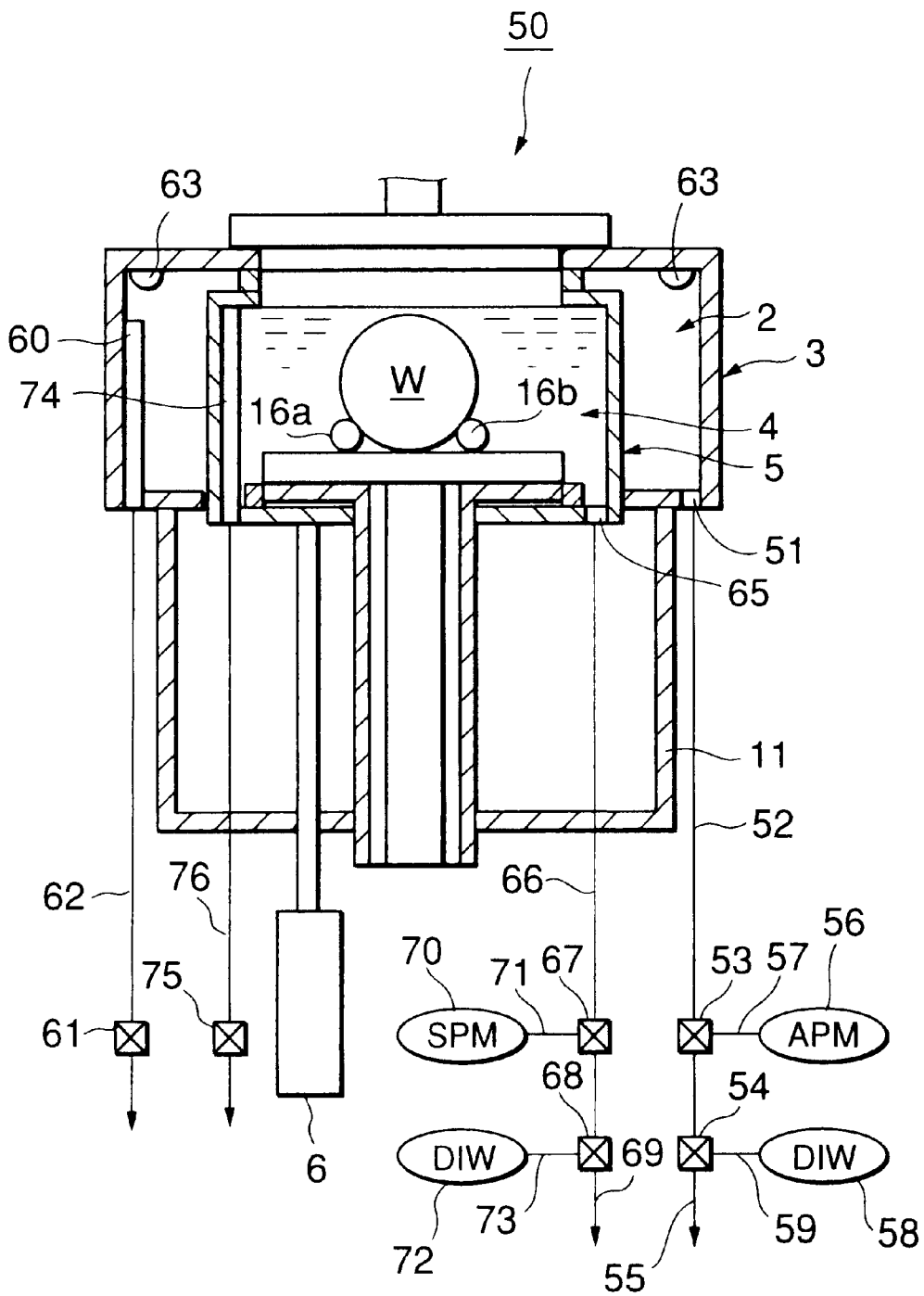
FIG. 9 is a full sectional view showing the interior structure of the cleaning apparatus of FIG. 8 on condition that the inner-cleaning bath enters into the outer cleaning bath.

Next, with reference to FIGS. 8 and 9, we describe a cleaning apparatus 50 in accordance with the second embodiment of the invention. While the previous cleaning apparatus 1 performs the SPM cleaning and the SCI cleaning by the orifices 20, 32, the cleaning apparatus 50 of this embodiment is constructed so as to perform the SPM cleaning by immersing the wafers W in the inner cleaning chamber 4 filled with the chemical SPM, and the SCI cleaning by immersing the wafers W in the outer cleaning chamber 2 filled with the chemical APM. The detailed constitution of the cleaning apparatus 50 will be described below. Note, in this cleaning apparatus 50, elements similar to those of the afore-mentioned cleaning apparatus 1 in terms of function and constitution are indicated with the same reference numerals respectively and therefore, their overlapping explanations are eliminated.

FIG. 8 shows a condition where the inner cleaning bath 5 has left the outer cleaning bath 3 as it is similar to FIG. 1. FIG. 9 shows a condition where the inner cleaning bath 5 has entered the outer cleaning bath 3 as similar to FIG. 4. As shown in FIGS. 8 and 9, the outer cleaning chamber 2 is provided, on its bottom, with a drain/supply port 51 to which a drain/supply tube 52 is connected. Also, the drain/supply tube 52 is connected with a drain tube 55 for draining the cleaning liquid from the outer cleaning chamber 2, through three-directional valves 53, 54. The three-directional valve 53 is also connected with an APM supply tube 57 for supplying the chemical APM, which has been fed from a APM supply source 56, into the outer cleaning chamber 2. While, the three-directional valve 54 is also connected with a pure water supply tube 59 for supplying pure water, which has been fed from a pure water (DIW) supply source 58, into the outer cleaning chamber 2. Therefore, with the switching operation of the three-directional valves 53, 53, the communication of the drain/supply tube 52 with either APM supply tube 57 or pure water supply tube 59 allows the chemical APM or pure water to be supplied into the outer cleaning chamber 2. While, the communication of the drain/supply tube 52 with the drain tube 55 allows the cleaning liquid to be discharged from the outer cleaning chamber 2.

Additionally, in the outer cleaning chamber 2, a drain pipe 60 is arranged so as to stand along the inside face of the chamber 2. The drain pipe 60 opens at the upper side of the outer cleaning chamber 2. Therefore, when the cleaning liquid is charged in excess of a predetermined level, the excessive liquid can be drained away the interior of the chamber 2 through the drain pipe 60. That is, the drain pipe 60 is connected with a drain tube 62 interposing a closing valve 61 and therefore, the release of the closing valve 61 allows the overflowing liquid to be discharged to the outside through the drain tube 62. Further, the outer cleaning chamber 2 is provided, on a ceiling face thereof, with gas outlets 63 for releasing dry gas.

Similarly to the outer cleaning chamber 2, the inner cleaning chamber 4 is also provided, on its bottom, with a drain/supply port 65 to which a drain/supply tube 66 is connected. Also, the drain/supply tube 66 is connected with a drain tube 69 through three-directional valves 67, 68. The three-directional valve 67 is also connected with an SPM supply tube 71 for supplying the chemical SPM, which has been fed from a SPM supply source 70, into the inner cleaning chamber 4. While, the three-directional valve 68 is connected with a pure water supply tube 73 for supplying pure water, which has been fed from a pure water (DIW) supply source 72, into the inner cleaning chamber 4. Therefore, owing to the switching operation of the three-directional valves 67, 68, it is possible to supply the chemical SPM or pure water into the inner cleaning chamber 4 and also possible to discharge the cleaning liquid from the chamber 4. Furthermore, in the inner cleaning chamber 4, a drain pipe 74 is provided so as to stand along the inside face of the chamber 4. The drain pipe 74 is connected with a drain tube 76 interposing a closing valve 75 and therefore, the release of the closing valve 75 allows the overflowing liquid in the chamber 4 to be discharged to the outside through the drain tube 76.

We now describe the cleaning operation of the wafers W performed by the above-mentioned cleaning apparatus 50. As shown in FIG. 8, after the upright wafers W of 25 pcs. (not cleaned) have been accommodated in the outer cleaning chamber 2, the elevating mechanism 6 operates to move the inner cleaning chamber 4 to the periphery of the wafers W for the SPM cleaning, as shown in FIG. 9. Then, with the switching operation of the three-directional valve 67 to the side of the SPM supply tube 71, the chemical SPM is supplied into the inner cleaning chamber 4 to immerse the wafers W in the chemical SPM. Simultaneously, with the release of the closing valve 75, the particles removed from the wafers' surfaces are discharged from the outside through the drain pipe 74 and the drain tube 76, together with the overflowing chemical SPM. In the above way, the SPM cleaning is performed.

After completing the SPM cleaning, the three-directional valves 67, 68 are together turned to the side of the drain tube 69 to discharge the chemical SPM from the inner cleaning chamber 4. Thereafter, the three-directional valve 68 is turned to the side of the pure water supply tube 73 to charge the pure wafer into the inner cleaning chamber 4. In this way, the wafers W are immersed in the pure water, performing the rinsing operation. Also in this case, the excessive pure water is discharged from the upper side of the inner cleaning chamber 4. Note, with the appropriate turning of the three-directional valve 68 to the side of the drain tube 69, the immersion and draining may be repeated in the modification.

When sequentially performing the SCI cleaning in the outer cleaning chamber 2, as shown in FIG. 8, the elevating mechanism 6 operates to leave the inner cleaning bath 5 from the outer cleaning bath 3, so that the wafers W are accommodated in the outer cleaning chamber 2. Then, with the switching operation of the three-directional valve 53 to the side of the APM supply tube 57, the chemical APM is supplied into the outer cleaning chamber 2 to immerse the wafers W in the chemical APM. Simultaneously, with the release of the closing valve 61, the particles removed from the wafers' surfaces and inorganic substances, such as metals, are discharged from the outside of the outer cleaning chamber 2 through the drain pipe 60 and the drain tube 62, together with the overflowing chemical APM. In the above way, the APM cleaning is performed.

After completing the SCI cleaning, the three-directional valves 53, 54 are together turned to the side of the drain tube 55 to discharge the chemical APM from the outer cleaning chamber 2. Thereafter, the three-directional valve 54 is turned to the side of the pure water supply tube 59 to charge the pure wafer into the outer cleaning chamber 2. In this way, the wafers W are immersed in the pure water, performing the rinsing operation. Also in this case, the excessive pure water is discharged from the upper side of the outer cleaning chamber 2. Similarly, with the appropriate turning of the three-directional valve 54 to the side of the drain tube 55, the immersion and draining may be repeated in the modification. Finally, the mixture gas of IPA vapor and heated $N_2$ gas is supplied through the gas outlets 63 to dry the wafers W. In this way, the cleaning apparatus 50 for immersing the wafers W in the cleaning liquid is also capable of performing the designated cleaning process appropriately.

Figure 10:
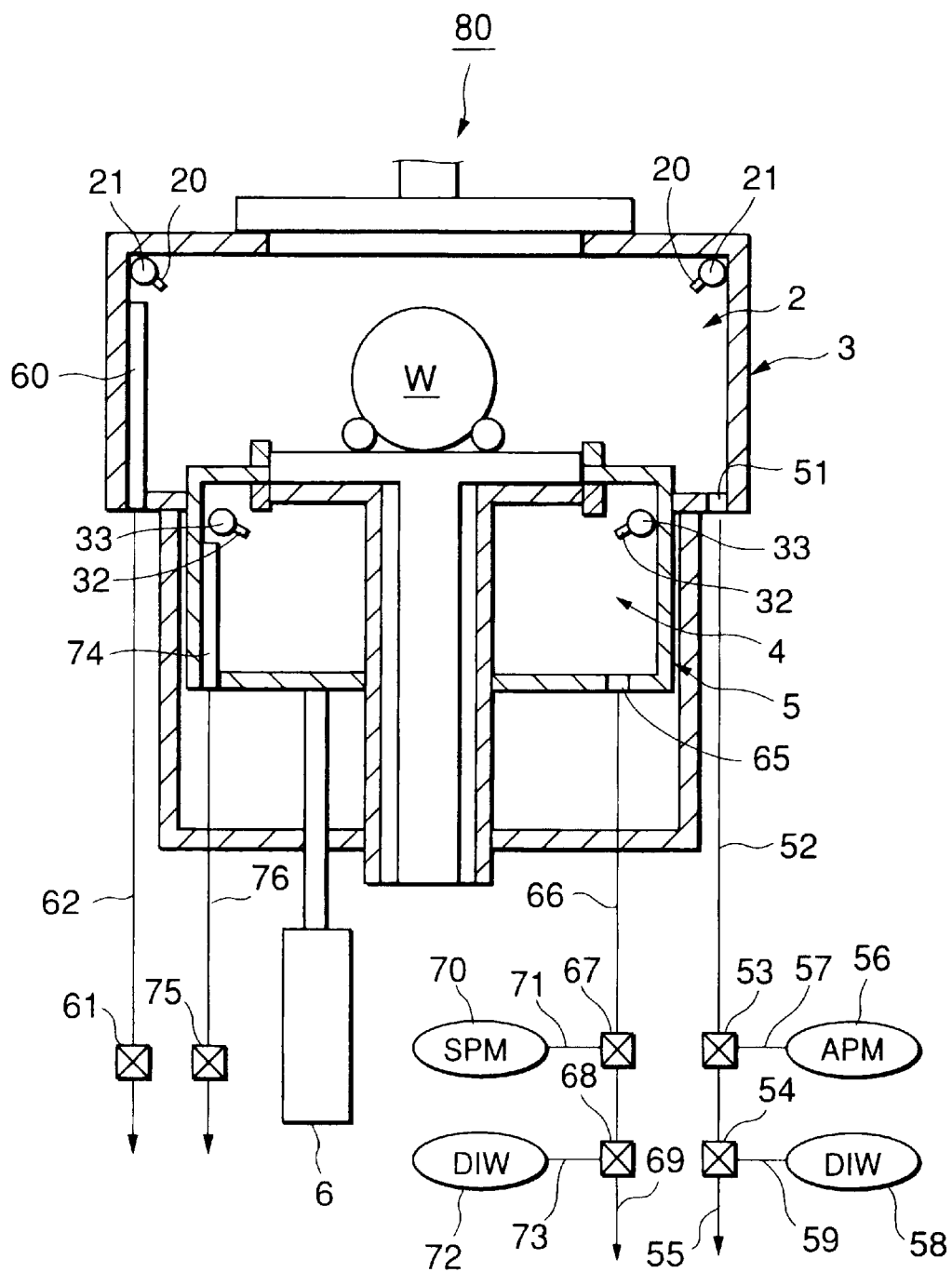
FIG. 10 is a full sectional view showing the interior structure of the cleaning apparatus of the third embodiment.

With reference to FIG. 10, the third embodiment of the invention will be described below. As shown in FIG. 10, a cleaning apparatus 80 of the embodiment is constructed so as to perform both "injection" cleaning by ejecting the cleaning liquid and "DIP" cleaning against the wafer W Thus, the outer cleaning chamber 2 is provided with the nozzles 21, while the inner cleaning chamber 4 is provided with the nozzles 33, thereby allowing the chemicals SPM, APM to be ejected toward the wafers W downward. Further, the outer cleaning chamber 2 is provided with the above-mentioned constituents, for example, the drain/supply port 51, the drain/supply tube 52, the drain pipe 60 and so on. The inner cleaning chamber 4 is provided with the above constituents, for example, the drain/supply port 65, the drain/supply tube 66, the drain pipe 74 and so on, allowing the wafers W to be immersed in the chemicals SPM, APM and pure water. With the above-mentioned constitution, since a variety of cleaning operations can be attained by free combining the injection cleaning with the DIP cleaning, it is possible to provide the apparatus with high applicability.

Further, the objects to be processed are not limited to the above wafers W and therefore, the present invention is also applicable for cleaning LCD substrates, glass substrates, CD substrates, photomasks, printed boards, ceramic substrates, etc. Additionally, the present invention can be applied to not only cleaning but an apparatus for applying a designated treatment liquid on the substrates and the method, an apparatus which supplies a process gas containing designated reactive components into a processing chamber thereby to process the substrates on physical, chemical reactions and the method, for example, plasma etching apparatus, plasma CVD apparatus, vacuum processing apparatus, etc.

Next, the fourth embodiment of the invention will be described below. In this embodiment, we describe a case of applying the present invention on the cleaning and drying apparatus for semiconductor wafers.

Figure 11:
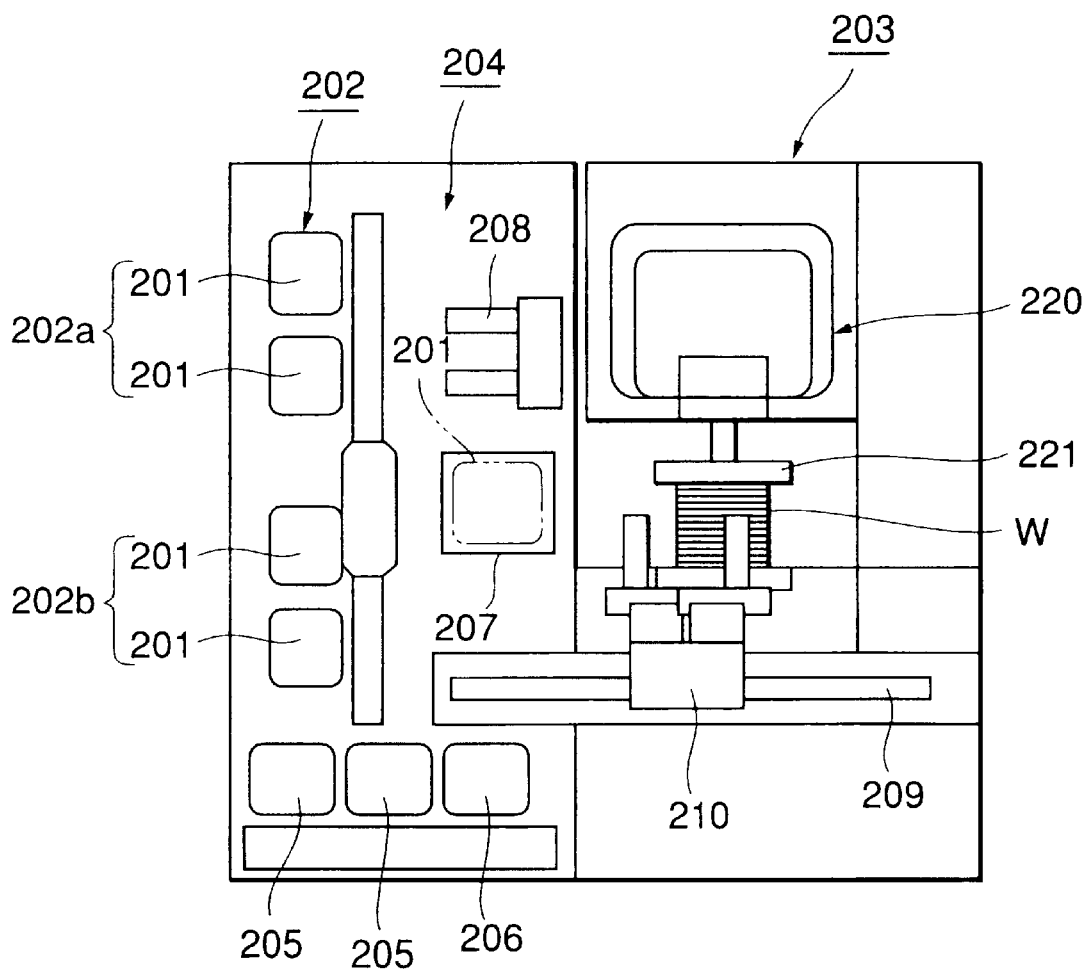
FIG. 11 is a schematic plan view of a cleaning and drying apparatus on application of the processing apparatus of the invention.

FIG. 11 is a schematic plan view showing one example of a cleaning and drying system to which the processing apparatus of the invention is applied.

The above cleaning and drying system essentially comprises a loading/unloading section 202 for loading and unloading carriers 201 in which the semi-conductor wafers W of e.g. 25 pcs. as the objects to be processed are accommodated horizontally, a processing section 203 for applying the liquid treatment and sequential drying on the wafers W and an interface section 204 disposed between the loading/unloading section 202 and the processing section 203 to carry out the delivery of the wafers W, the positional adjustment, the posture change, etc. Note, beside the loading/unloading section 202 and the interface section 204, there are carrier stocks 205 each accommodating the vacant carrier 201 temporarily and a carrier cleaner 206 for cleaning the carrier 201.

The above loading/unloading section 202 is arranged on one side of the cleaning and drying apparatus and includes a carrier loading part 202a and a carrier unloading part 202b juxtaposed with each other.

The interface section 204 is provided with a carrier mount 207. Arranged between the carrier mount 207 and the loading/unloading section 202 is a carrier transporting unit 208 which transports the carrier 201 brought from the carrier loading part 202a to the carrier mount 207 or the carrier stock 205 and also conveys the carrier 201 on the carrier mount 207 to the carrier unloading part 202b or the carrier stock 205. Further, the interface section 204 is provided with a conveyer path 209 which extends up to the processing section 203 and on which a wafer transporting unit, for example, a wafer transporting chuck 210 is movably mounted. The wafer transporting chuck 210 is constructed so as to transport the wafers W (not processed), which have been brought from the carrier 201 on the carrier mount 207, to the processing section 203 and also load the wafers W processed by the processing section 203 into the carrier 201.

While, the above processing section 203 is provided with a processing apparatus 220 of the invention, which removes resists, polymers, etc. from the wafers W. The processing apparatus 220 of the invention will be described below.

Figure 12:
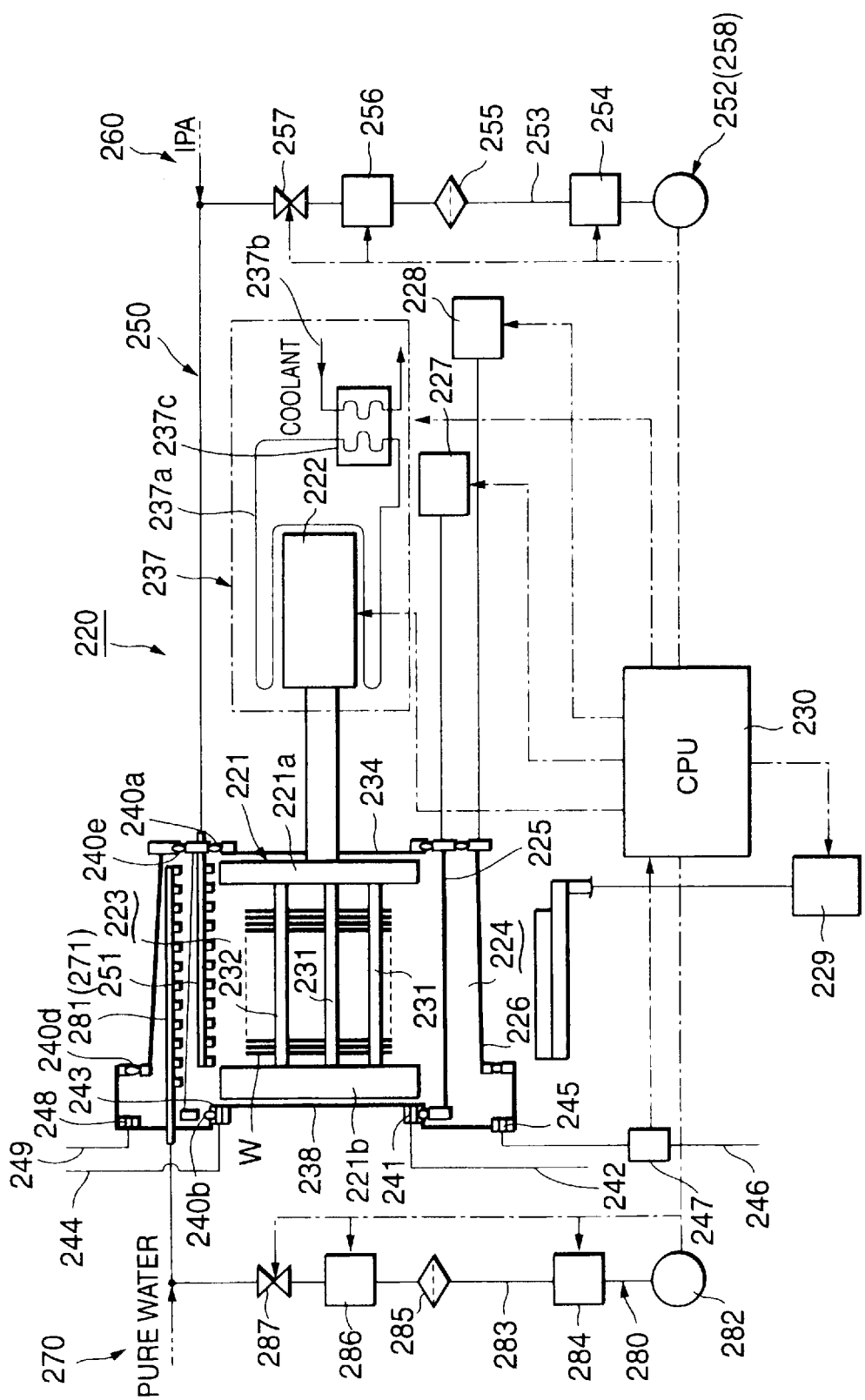
FIG. 12 is a schematically structural diagram showing a processing apparatus of the fourth embodiment of the invention.

As shown in FIG. 12, the above processing apparatus 220 is mainly constituted by the following elements: a rotatable wafer carrying unit, for example, a rotor 221; a drive unit for rotating the rotor 221, for example, a motor 222; an inner chamber 223 in plural processing chambers (e.g. first and second processing chambers) surrounding the wafers W on the rotor 221; an outer chamber 224; a supply unit 250 for supplying processing fluid, for example, chemicals of resist stripper, polymer remover, etc. to the wafers W accommodated in the inner chamber 223 and the outer chamber 224; another supply unit 260 for supplying the solution for chemicals, for example, isopropyl alcohol (IPA), a rinsing liquid supply unit 270 for rinsing liquid (e.g. pure water) or a dry fluid supply unit 280 for dry gas (fluid), such as inert gas (e.g. $N_2$ gas), fresh air, etc. (the supply units 250, 280 are shown in FIG. 11); a moving unit (e.g. first and second cylinders 227, 228) for moving an inner cylinder 225 constituting the inner chamber 223 and an outer cylinder 226 constituting the outer chamber 224 to a wafer surrounding position and a stand-by position apart from the wafer surrounding position; and an object delivery unit (e.g. a wafer delivery hand 229) for receiving the wafers W from the wafer transporting chuck 210 and delivering them to the rotor 221, and vice versa.

The motor 222, the respective units 250, 260, 270, 280 (FIG. 11 shows the supply units 250, 280), the wafer delivery hand 229, etc. of the processing apparatus 220 constructed above, are controlled by a control unit, for example, a central processing unit 230 (referred CPU 230 below).

Figure 13:
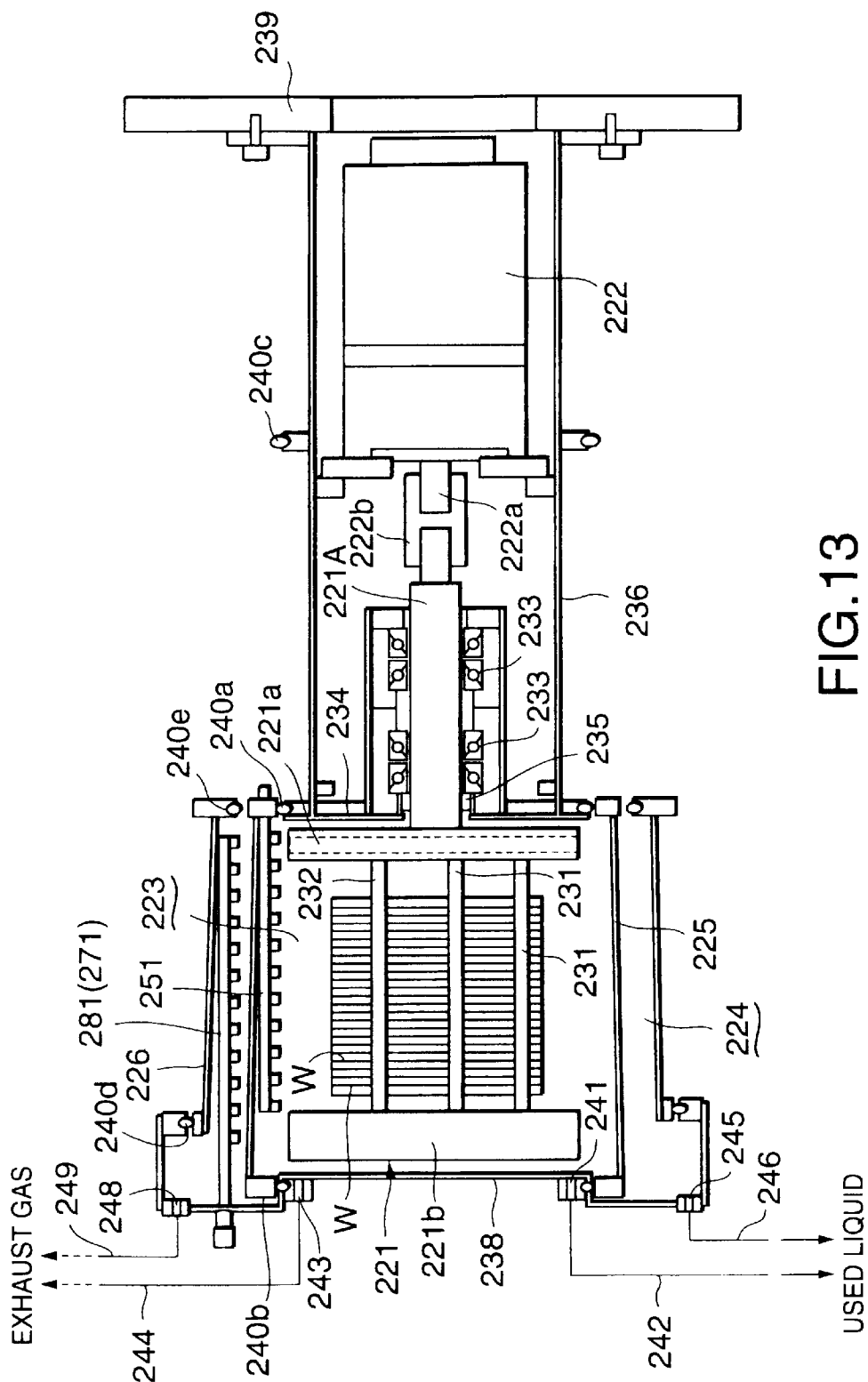
FIG. 13 is a sectional view of an essential part of the processing apparatus of FIG. 12.

As shown in FIG. 13, the rotor 211 is connected to a drive shaft 222a of the horizontally-arranged motor 222 in the manner of a cantilever. The rotor 211 carries the wafers W so that their surfaces to be processed stand perpendicularly and is adapted so as to be rotatable about the horizontal axis. The rotor 221 includes a first rotor disc 221a having a rotor shaft 221A connected to the drive shaft 222a of the motor 222 through a coupling 222b, a second rotor disc 221b opposing the first rotor disc 221a, several (e.g. four pieces) fixing rods 231 laying between the first rotor disc 221a and the second rotor disc 221b, and a pair of pusher rods 232 which are movable between their pushing position and their non-pushing position by not shown locking and lock-releasing units (both not shown), for holding the upper portions of the wafers W retained in retaining grooves 231a (see FIG. 20). A first fixing wall 234 through bearings 233 rotatably supports the rotor shaft 221A of the rotor 221. Further, owing to the provision of a labyrinth seal 235 succeeding to the bearing 333 on the side of the first fixing wall 234, the rotor 211 is constructed so as to prevent the invasion of particles etc. produced from the motor 222 into the processing chamber (see FIG. 13). Note, the motor 222 is accommodated in a cylinder 236 successively connected to the first fixing wall 234. The motor 222 is controlled so as to be repeatedly and selectively operable at predetermined high-speed rotation, for example, 100–3000 rpm and low-speed rotation, for example, 1–500 rpm in accordance with the program stored in the CPU 230 in advance. Note, although the above-exemplified ranges of high and low rotations overlap each other in part, either low-speed range or high-speed range is generally established with respect to the viscosity of chemical liquid and therefore, the ranges of high and low rotations do not overlap each other in case of the identical chemical liquid, which is similar in the descriptions hereinbelow. Here, the low-speed rotation means a low speed in comparison with the number of rotations which allows the chemical adhering to the wafers' surfaces to be removed by the rotor's centrifugal force, while the high-speed rotation means a high speed in comparison with the number of rotations which allows the supplied chemical liquid to contact with the wafers W thereby effecting the sufficient reaction.

Therefore, since the motor 222 may be overheated due to the repetition of high-speed rotations and low-speed rotations, the motor 222 is provided with a cooling unit 237 for restricting the motor's overheating. As shown in FIG. 12, the cooling unit 237 is constituted by a circulatory cooling pipe 237a around the motor 222 and a heat exchanger 237c containing a part of the cooling pipe 237a and a part of coolant supply pipe 237b, for cooling coolant enclosed in the cooling pipe 237a. Employed as the coolant is an electrically-insulating and heat-conductive liquid which would not cause a short circuit in the motor 222 in spite of the liquid's leakage, for example, ethylene glycol. Further, the cooling unit 237 is controlled by the CPU 230 so as to operate in accordance with the information detected by a not-shown temperature sensor. It is noted that the cooling unit 237 is not always provided with the above-mentioned structure and therefore, it is at the option of the user, for example, an air-cooled unit, an electric cooling unit with Peltier elements, etc.

While, the processing chamber, for example, the inner chamber 233 (first processing chamber) is defined by the first fixing wall 234, the opposing second fixing wall 238 and the inner cylinder 225 engaging with the first and second fixing walls 234, 238 through first and second seaming members 240a, 240b, respectively. That is, with the expansion of the first cylinder 227, the inner cylinder 225 is moved to the position surrounding the wafers W together with the rotor 221 to define the inner chamber 223 (first processing chamber) sealed to the first fixing wall 234 through the first sealing member 240a and also sealed to the second fixing wall 238 through the second sealing member 240b (see FIGS. 13 and 16). Again, the inner cylinder 225 is adapted so as to move to the outside of the cylinder 236 (stand-by position) by the shrinkage of the first cylinder 227 (see FIGS. 14, 15 and 16). Then, the inner cylinder 225 has its leading opening sealed to the first fixing wall 234 through the first sealing member 240a and a cylinder's base sealed to the cylinder 236 through a third sealing member 240c formed around the intermediate part of the cylinder 236, preventing the leakage of atmosphere of chemicals remained in the inner chamber 223.

Figure 14:
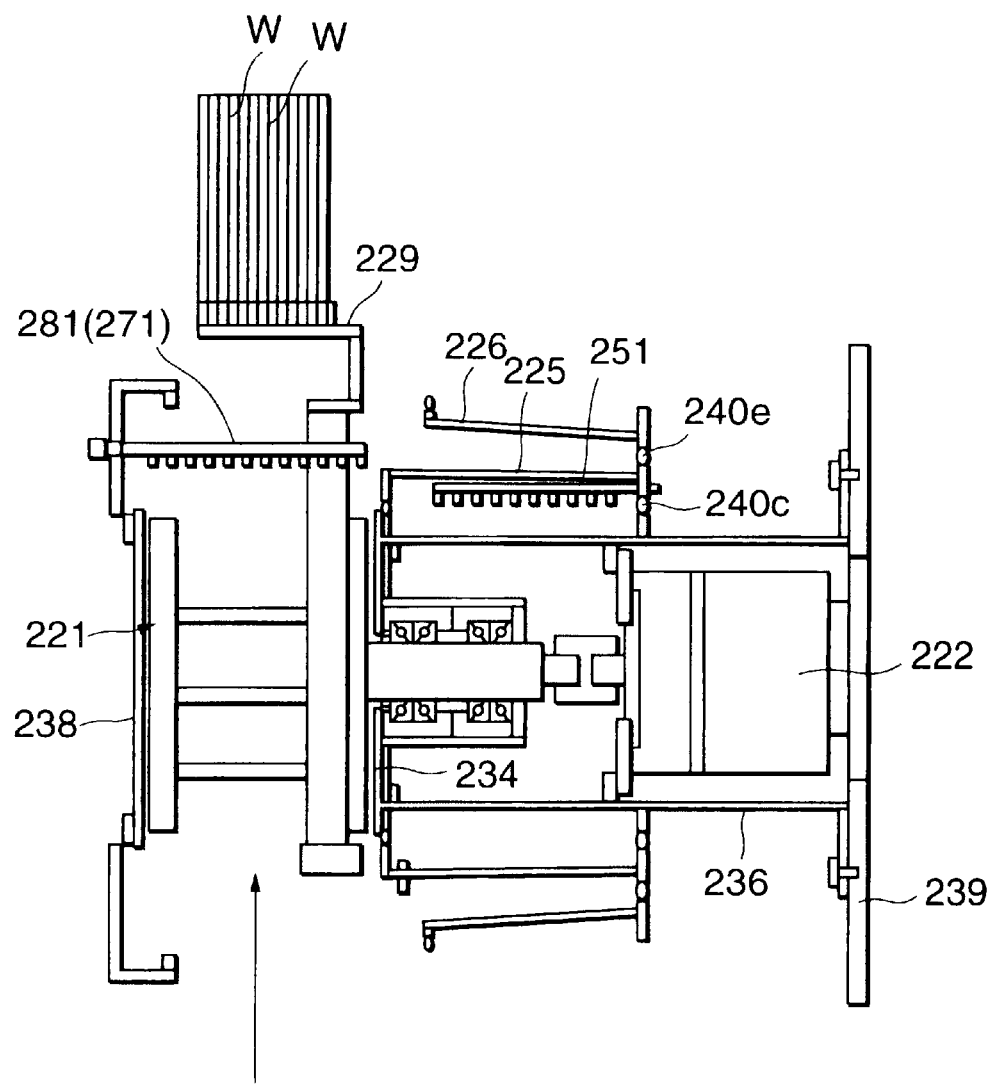
FIG. 14 is a schematic sectional view of the processing apparatus of FIG. 13, showing its condition to accept the wafers.
Figure 15:
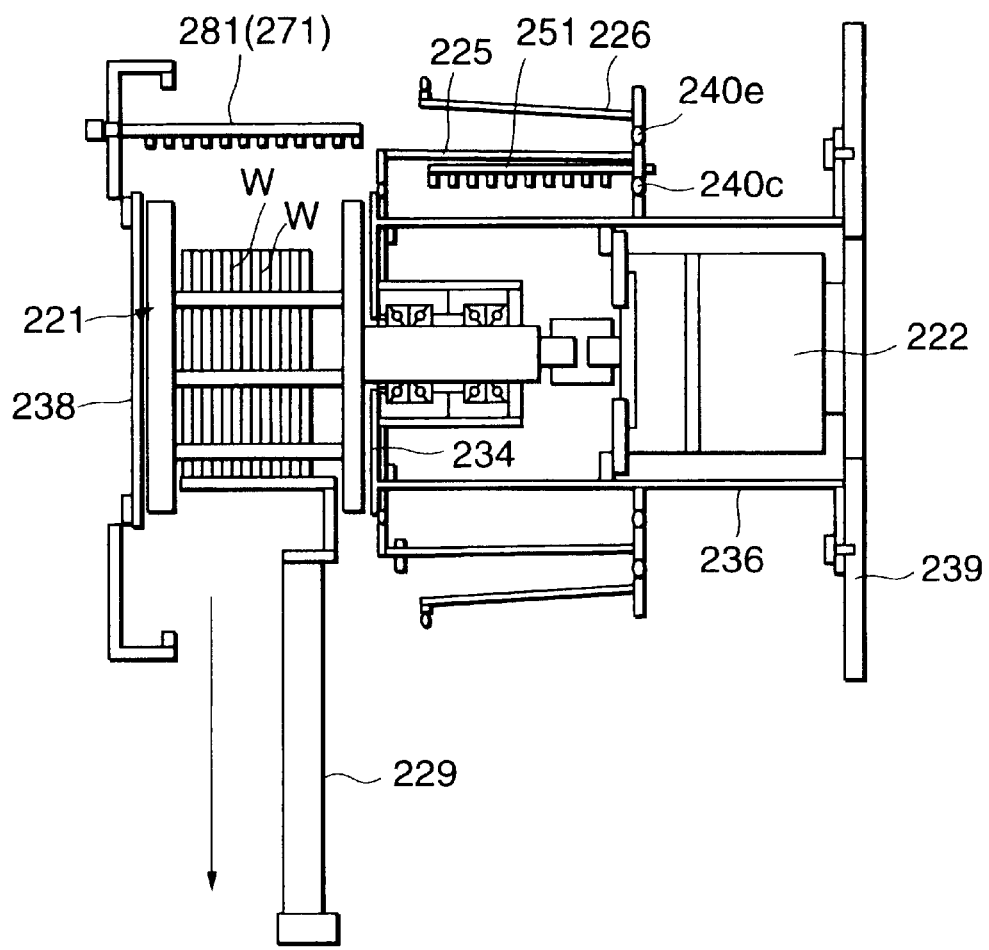
FIG. 15 is a schematic sectional view of the processing apparatus of FIG. 13, showing its condition to deliver the wafers to a rotor.

The outer chamber 224 (second processing chamber) is defined by the first fixing wall 234 interposing the seal member 240b between the inner cylinder 225 moved to the stand-by position and the wall 234, the second fixing wall 238, and the outer cylinder 226 engaging with the second fixing wall 238 and the inner cylinder 225 through a fourth sealing member 240d and a fifth sealing member 240e, respectively. Thus, with the expansion of the second cylinder 228 as the moving unit, the outer cylinder 226 is moved to the position surrounding the wafers W together with the rotor 221 and sealed to the second fixing wall 238 and the inner cylinder 225 through the fourth sealing member 240d and the fifth sealing member 240e respectively, forming the outer chamber 224 (second processing chamber; see FIG. 17). Also, the outer cylinder 226 is adapted so as to move to the stand-by position outside the fixed cylinder 236 with the shrinkage of the second cylinder 228 (FIGS. 14 and 15). In this case, the fifth sealing member 240e is interposed between the respective base ends of the outer cylinder 226 and the inner cylinder 225. Therefore, since the inside atmosphere of the inner chamber 223 and the inner atmosphere of the outer chamber 224 are separated from each other in a fluid-tight manner, there is no possibility of a mixture of the atmospheres in both chambers 223, 224, preventing the cross-contamination resulting from the reaction of different processing liquids.

Note, the above 1st. to 5th. sealing members 240a to 240e are constituted by sealing mechanisms each enclosing compressive air into a hollow packing (e.g. rubber gasket) inflatable-fitted to one side of the object being sealed.

Figure 19:
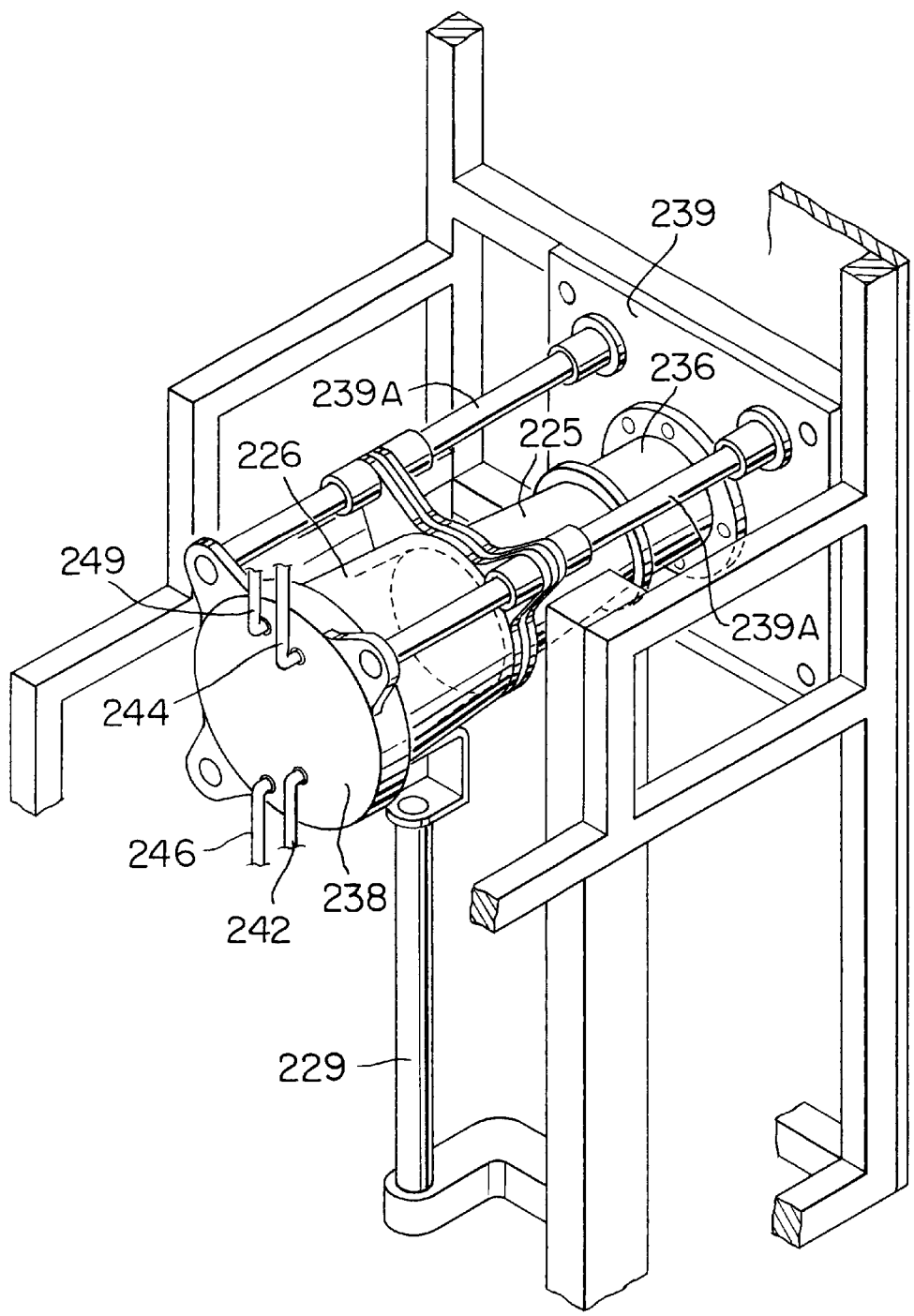
FIG. 19 is a perspective view showing an inner cylinder and an outer cylinder of the processing apparatus of FIG. 13.
Figure 20:
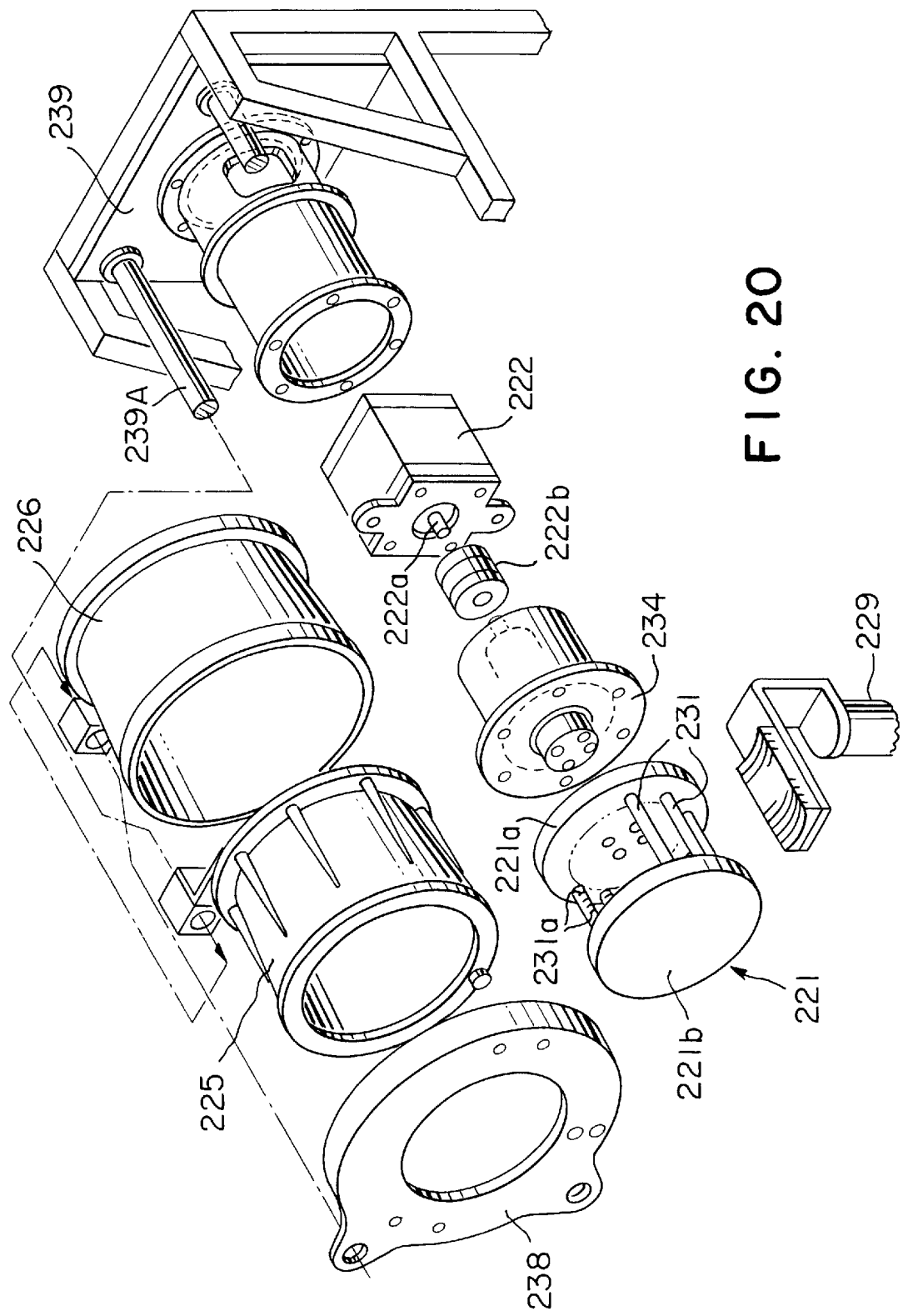
FIG. 20 is an exploded perspective view showing the inner cylinder and the outer cylinder of FIG. 19.
Figure 21:
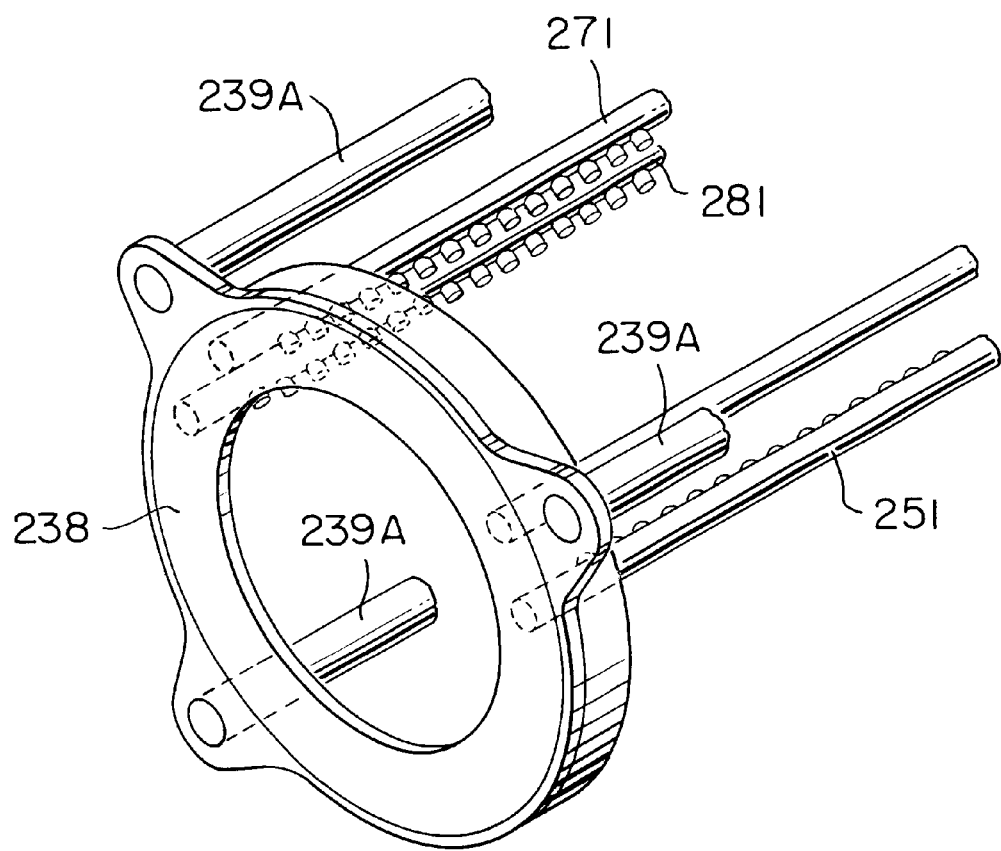
FIG. 21 is a perspective view of gas/liquid separating means of FIG. 20.

The above-contracted inner and outer cylinders 225, 226 are together tapered so as to expand toward their tips gradually. As shown in FIGS. 19 and 20, these cylinders 225, 226 are adapted so as to slide along a plurality of parallel guide rails 239A (three pieces in the shown embodiment) extending among the first fixing wall 234, the second fixing wall 238 and a sidewall 239 all opposing each other on an identical horizontal line. Consequently, with the expansion and contraction of the first and second cylinders 227, 228, the cylinders 225, 226 can project, withdraw and overlap with each other coaxially. Due to the tapered formation of the inner and outer cylinders 225, 226, when rotating the rotor 221 in the inner cylinder 225 or the outer cylinder 226, there is produced an air stream which flows toward the expanded side of the cylinder in a spiral manner, thereby facilitating the discharge of inside chemicals to the expanded side. Furthermore, owing to the coaxially overlapping structure of the cylinders 225, 226, it is possible to reduce the installation space for the inner and outer cylinders 225, 226 and the inner and outer chambers 223, 224, accomplishing the miniaturization of the apparatus.

The inner and outer cylinders 225, 226 are made of stainless steel. Additionally, the inner cylinder 225 is provided, on its outer periphery, with a thermal insulating layer made of e.g. polytetrafluoroethylene (trademark: Teflon), which prevents the cool-down of chemicals supplied for the treatment in the inner chamber 223.

Figure 18:
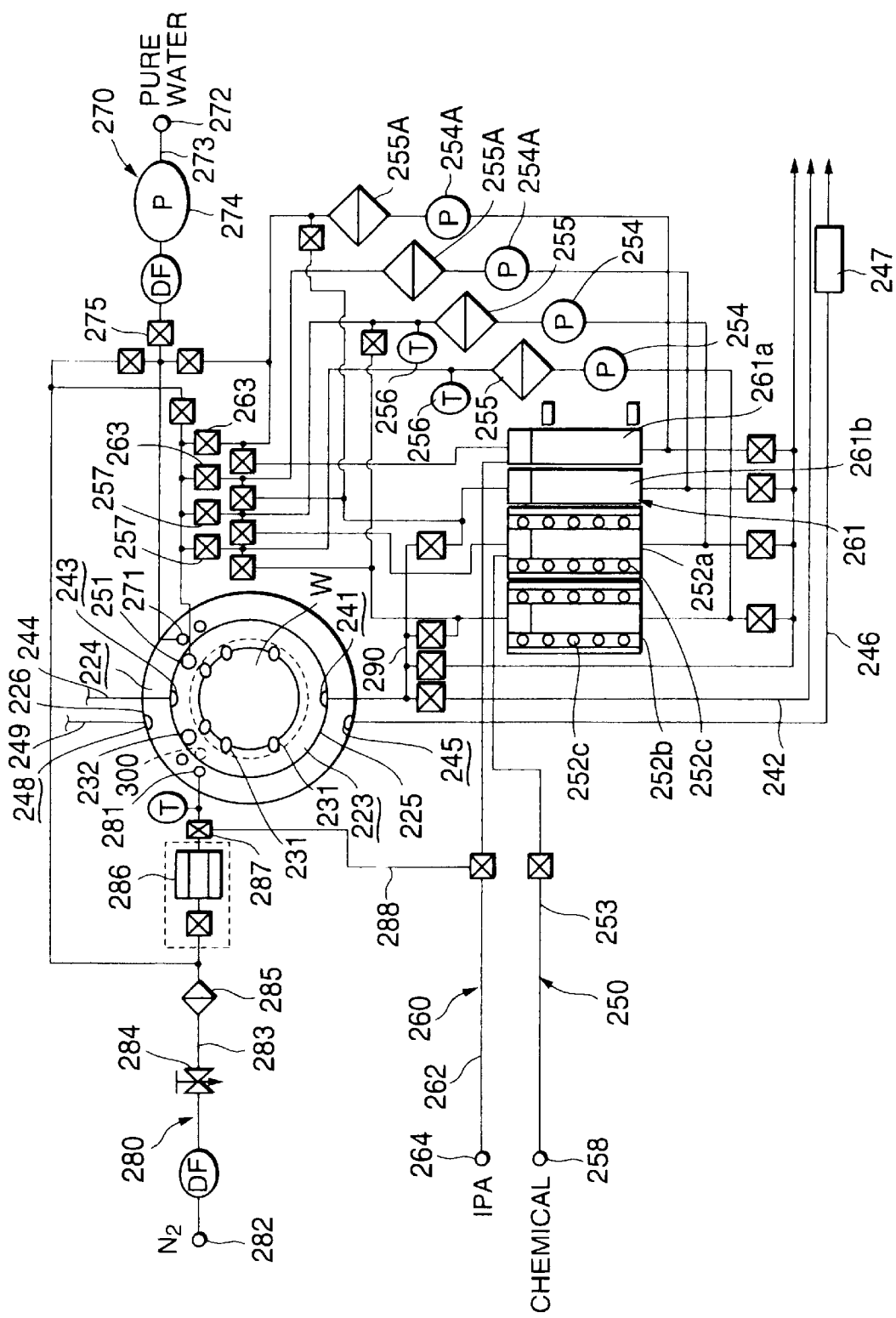
FIG. 18 is a schematic-piping diagram showing a piping system of the processing apparatus of FIG. 12.

In the above-mentioned supply units for the treatment liquids, as shown in FIGS. 12, 13 and 18, the supply unit 250 for the chemical (e.g. polymer remover) includes a chemical supply nozzle 251 attached to the inner cylinder 225, a chemical supply part 252, a pump 254 disposed in a chemical pipe line 252 connecting the nozzle 251 with the part 252, a filter 255, a temperature controller 256 and a chemical supply valve 257. In this case, the chemical supply part 252 is constituted by a chemical source 258, a chemical tank 252a for storing a new chemical supplied from the source 258 and a circulation tank 252b for storing the chemical which has been supplied for the treatment. The inner chamber 223 is provided, at its lower part on the expanded side, with a first drain port 241 to which a first drain pipe 242 is connected. The first drain pipe 242 is also connected to a circulation pipe line 290 through a switching valve (not shown). Note, the inner chamber 223 is provided, at its upper part on the expanded side, with a first exhaust port 243 to which a first exhaust pipe 244 is connected while interposing a not-shown closing valve. Outside the supply tanks 252a, 252b, thermal control heaters 252c are arranged to maintain the chemicals in the tanks 252a, 252b at designated temperatures, respectively. In order to uniformly supply the chemical liquid to the overall wafers W of the plural number (e.g. 25 pcs.) being carried in the rotor 221, the above chemical supply nozzle 251 is provided in the form of a "shower" nozzle having twenty-six orifices (not shown) positioned outside the outermost wafers W and also among the respective wafers W. Additionally, the nozzle 251 is also constructed so as to eject the chemical in a substantial fan form through the orifices. Accordingly, with the chemical supply via the orifices of the nozzle 251 against the wafers W rotating with the rotor 221, it is possible to supply the chemical to the wafers W of the plural number (e.g. 25 pcs.) carried in the rotor 221 uniformly. Note, in case of the supply of chemical to the respective front sides of the wafers W only, the nozzle 251 has only to possess twenty-five orifices. It is noted that, in the above-mentioned arrangement, every wafers W are carried in the rotor 221 at an interval equal to that of the previous arrangement where the wafers W of 25 pcs. are accommodated in the carrier 201. While, in the modification, the rotor 221 may carry the wafers W of e.g. 50 pcs. at half that interval. In such a case, the nozzle 251 would be provided with nozzle orifices of 50 or 51 pcs.

As shown in FIG. 18, the supply unit 260 for supplying the solution for chemicals, such as IPA, includes the supply nozzle 251 also operating as the above chemical supply nozzle attached to the inner cylinder 225 (represented by "the chemical supply nozzle 251" later), a solvent supply part 261, a pump 254A disposed in a IPA pipe line 262 connecting the supply nozzle 251 with the chemical supply part 252, a filter 255A and an IPA supply valve 263. Here, the solvent for chemicals designates a liquid which does not react with the chemicals, and also the rinsing liquid used in the sequent process but only washable away the chemicals sticking to the wafers W and the chamber. In this case, the solvent supply part 261 is constituted by a solvent (e.g. IPA) source 264, an IPA supply tank 261a for storing fresh IPA being supplied from the IPA source 264 and a circulation supply tank 261b for storing IPA used in the process. A circulation pipe line 290 is connected with both of the IPA supply tanks 261a, 261b through not-shown switching valves (switching means). The circulation pipe line 290 is also connected with the first drain pipe 242 connected with the first drain port 241 formed on the lower part of the expanded side of the inner chamber 233.

While, as shown in FIGS. 12, 13 and 18, the rinsing liquid supply unit 270 for rinsing liquid (e.g. pure water) includes a pure-water supply nozzle 271 attached to the second fixing wall 238, a pure-water source 272, a supply pump 274 and a pure-water supply valve 275 both disposed in a pure-water pipe line 273 which connects the nozzle 271 with the source 272. In this case, the pure-water supply nozzle 271 is positioned outside the inner chamber 223 and inside the outer chamber 224. With the arrangement, when the inner cylinder 225 moves back to the stand-by position and the outer cylinder 226 moves to the position to surround the rotor 221 and the wafers W thereby to define the outer chamber 224, then the nozzle 271 is positioned in the outer chamber 224 to supply the pure water to the wafers W.

The outer chamber 224 is also provided, on its lower part of the expanded side, with a second drain port 245 to which a second drain pipe 246 is connected through a not-shown closing valve. Note, the second drain pipe 246 is provided, on its way, with a specific resistance meter 247 which detects a specific resistance of pure water provided for the rinsing process and transmits the detected resistance to the CPU 230. Accordingly, owing to the provision of the meter 247, the present situation of rinsing process is continuously monitored, so that it will be completed on condition of the judgement of appropriate rinsing process.

Again, the outer chamber 224 is also provided, on its upper part of the expanded side, with a second drain port 248 to which a second drain pipe 249 is connected through a not-shown closing valve.

As shown in FIGS. 12, 13 and 18, a dry fluid supply unit 280 includes a dry fluid supply nozzle 281 fixed on the second fixing wall 238, a dry fluid source (e.g. $N_2$) 282, a closing valve 284 interposed in a dry fluid pipe line 283 connecting the nozzle 281 with the source 282, a filter 285 and a $N_2$-temperature controller 286. On the downstream side of the controller 286, the pipe line 283 is also connected with a branch pipe line 288 through a switching valve 287. The branch pipe line 288 is diverged from the IPA pipe line 262. In this case, as similar to the pure-water supply nozzle 271, the dry fluid supply nozzle 281 is positioned outside the inner chamber 223 and also inside the outer chamber 224. With the retreat of the inner cylinder 225 to the stand-by position and the movement of outer cylinder 226 to the position surrounding the rotor 221 and the wafers W, then the dry fluid supply nozzle 281 is positioned in the outer chamber 224 to spray the mixture of $N_2$ gas and IPA against the wafers W. Then, after drying the wafers W with the mixture of $N_2$ gas and IPA, it is further executed to dry them with $N_2$ gas only. Note, in the modification, the mixture of $N_2$ gas and IPA may be replaced with $N_2$ gas only.

Note, all the operations of the chemical supply unit 250, the IPA supply unit 260, the pumps 254, 254A of the pure-water supply unit 270 and the dry fluid supply unit 280, the temperature controller 256, the $N_2$ temperature controller 286, the chemical supply valve 257, the IPA supply valve 263 and the switching valve 287 are controlled by the CPU 230 (see FIG. 12).

Note, the above-constructed processing apparatus 220 is disposed in a processing space provided, on its upside, with a filter unit (not shown) which always flows fresh air downward.

Next, we describe the operation of the cleaning and drying apparatus of the present invention. First, the carrier transporting unit 208 transports the carrier 201 accommodating the unprocessed wafers W, which has been loaded into the carrier loading part 202a of the loading/unloading section 202, onto the carrier mount 207. Next, the wafer transporting chuck 210 moves onto the carrier mount 207 to unload the wafers W from the carrier 201 and sequentially transfers the wafers W to the upside of the processing apparatus 220 in the processing section 203, namely, the upside position of the rotor 221 under condition that the inner cylinder 225 and the outer cylinder 226 are retreating to the stand-by position. Then, as shown in FIG. 14, the wafer delivery hand 229 rises to receive the wafers W transported by the wafer transporting chuck 210 and sequentially falls to deliver the wafers W onto the fixing rods 231 on the rotor 221 and thereafter, the hand 229 returns to the initial position. After delivering the wafers W onto the rods 231, owing to the operation of not-shown locking means, the pusher rods 232 are moved to the upper edges of the wafers W in order to hold them (see FIG. 15).

Figure 16:
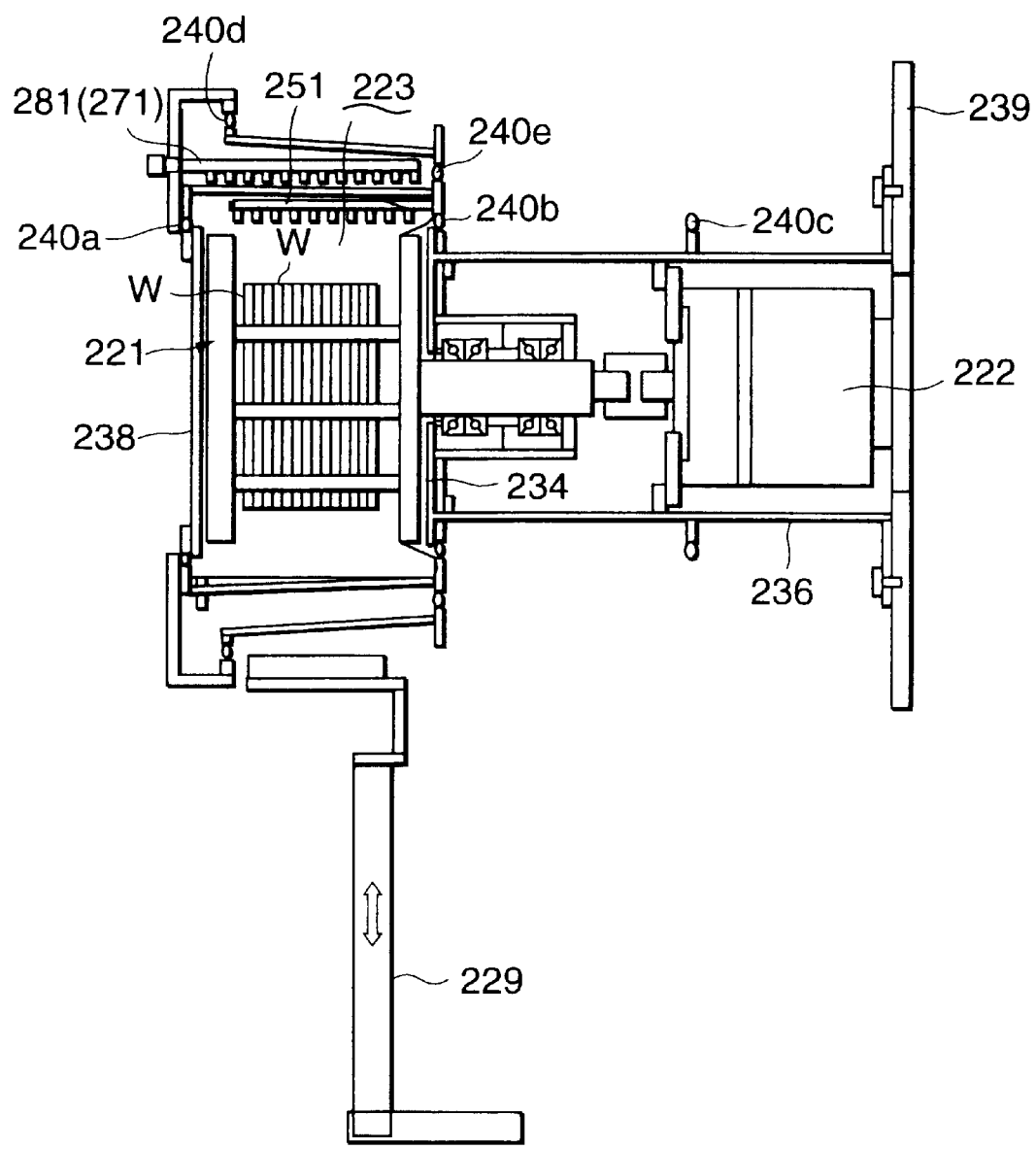
FIG. 16 is a schematic sectional view of the processing apparatus of FIG. 13, showing its chemical process and chemical removing process in an inner chamber.

Once the wafers W are set on the rotor 221 in the above way, as shown in FIG. 16, the inner cylinder 225 and the outer cylinder 226 move to the position to surround the rotor 211 and the wafers W, so that they are accommodated in the inner chamber 223. In this state, the chemical treatment is carried out while supplying the chemical to the wafers W. In the chemical treatment, while rotating the rotor 221 and the wafers W at a low speed, for example, 1 to 500 rpm, the chemical is first supplied for a predetermined period, e.g. dozens of seconds and thereafter, the supply of chemical is stopped. Subsequently, the rotor 221 and the wafers W are rotated at a high speed, e.g. 100 to 3000 rpm for several seconds in order to blow the chemical sticking to the wafers' surfaces off. The chemical treatment is completed by repeating both above chemical supply process and chemical blow-off process from several times to thousands of times. Note, as shown with two-dot chain line of FIG. 18, if a $N_2$-knife nozzle 300 is arranged in the inner cylinder 225 to further eject $N_2$ gas to the wafers W during blowing the chemical off, the removal of the chemical would be carried out promptly. In this case, the $N_2$-knife nozzle 300 may be connected to the dry fluid supply nozzle 281 of the dry fluid supply unit 280 through a not-shown closing valve.

Firstly supplied for the above chemical treatment process is the chemical which has been stored in the circulation tank 252b. After using, the first-used chemical is thrown away through the first drain pipe 282. In the sequential process, the chemical also stored in the circulation tank 252b is supplied for circulation. At the end of the chemical treatment, the new chemical, which has been supplied from the source 258 into the chemical tank 252a, is used to complete the chemical treatment.

Note, at the chemical treatment process, the chemical supplied for this process is collected to the first drain port 241 and discharged into the circulating pipe line 245 of the chemical supply part 252 or the first drain pipe 242 by the operation of a switching valve (not shown), while the gas originated in the chemical is discharged from the first exhaust pipe 244 through the first exhaust port 243.

After completing the chemical treatment, the chemical removing (i.e. rinsing) process is executed while accommodating the wafers W in the inner chamber 233. In this process, while rotating the rotor 221 and the wafers W at a low speed, for example, 1 to 500 rpm, the chemical IPA is first supplied through the chemical supply nozzle 251 of the IPA supply unit 260 for a predetermined period, e.g. dozens of seconds and thereafter, the supply of the chemical IPA is stopped. Subsequently, the rotor 221 and the wafers W are rotated at a high speed, e.g. 100 to 3000 rpm for several seconds in order to blow the chemical IPA sticking to the wafers' surfaces off. The chemical removing process is completed by repeating both chemical IPA supply process and IPA blow-off process from several times to thousands of times. Similarly as the previous chemical treatment process, the chemical IPA firstly supplied for the above chemical treatment process is one which has been stored in the circulation tank 261b. After using, the first-used chemical IPA is thrown away through the first drain pipe 242. In the sequential process, the chemical IPA also stored in the circulation tank 261b is supplied for circulation. At the end of the chemical removing process, a new chemical IPA, which has been supplied from the IPA source 264 into the supply tank 261a, is used to complete the chemical removing process.

Note, at the chemical removing process, the chemical IPA supplied for this process is collected to the first drain port 241 and discharged into the circulation pipe line 290 of the solvent supply part 261 or the first drain pipe 242 by the operation of the switching valve (not shown), while the IPA gas is discharged from the first exhaust pipe 244 through the first exhaust port 243.

Figure 17:
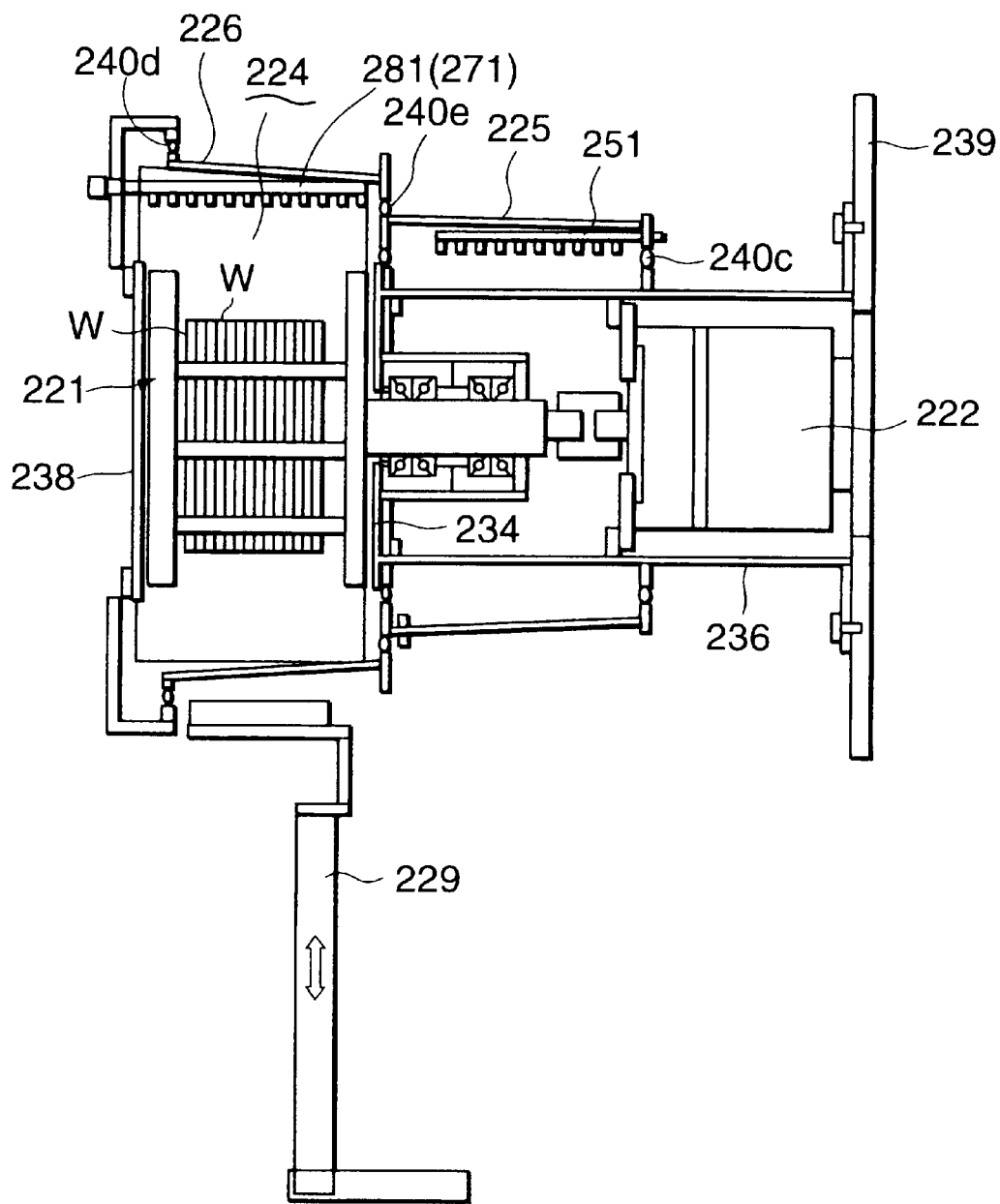
FIG. 17 is a schematic sectional view of the processing apparatus of FIG. 13, showing its rinsing process and drying process in an outer chamber.

After the chemical treatment and the sequent rinsing have been completed, as shown in FIG. 17, the inner cylinder 225 moves back to the stand-by position. Consequently, the rotor 221 and the wafers W are surrounded by the outer cylinder 226, in other words, accommodated in the outer chamber 224. Therefore, even if the liquid(s) drops from the wafers W processed in the inner chamber 223, such a droplet(s) can be received by the outer chamber 224. In this state, the rinsing liquid, e.g. pure water is supplied to the rotating wafers W through the pure-water supply nozzle 271 of the rinsing liquid supply unit. The pure water supplied in the rinsing process and the removed chemical IPA is drained from the second drain pipe 246 via the second drain port 245. Further, gas produced in the outer chamber 224 is discharged from the second exhaust pipe 249 to the outside through the second exhaust port 248.

After performing the rinsing process for the predetermined period, it is executed to supply the mixture of $N_2$ gas and IPA from the gas source 282 and the IPA source 264 to the rotating wafers W while accommodating the them in the outer chamber 224, in order to remove pure water sticking to the wafers' surfaces. Consequently, the wafers W and the outer chamber 224 can be together dried by the mixture of $N_2$ gas and IPA. Further, by supplying $N_2$ gas only to the wafers W after the drying process has been completed by the mixture of $N_2$ gas and IPA, the drying of the wafers W and the outer chamber 224 can be carried out more effectively.

After completing the chemical treatment process for the wafers W, the chemical removing process, the rinsing process and the drying process, the outer cylinder 226 moves back to the stand-by position on the peripheral side of the inner cylinder 225, while the operation of a not-shown delocking unit allows the wafer pusher rods 232 to retreat from their wafer holding position. Then, the wafer delivery hand 229 is elevated to receive the wafers W carried by the fixing rods 231 and moved to the upside of the processing apparatus 220 on receipt of the wafers W. Next, the wafers W above the processing apparatus are transported to the interface section 204 by the wafer transporting chuck 210 and loaded into the carrier 201 on the carrier mount 207. Then, the carrier 201 having the processed wafers W is transported to the carrier unloading part 202b by the carrier transporting unit 208 and thereafter, the wafers W are discharged outside the apparatus.

In the above-mentioned embodiment, with the arrangement where the rotor 221, the inner cylinder 225 and the outer cylinder 226 are arranged on the horizontal axis of the apparatus, the chemical treatment process, the chemical removing process, the rinsing process and the drying process are carried out while rotating the wafers' surfaces in perpendicular to the horizontal axis. Conversely, with the arrangement where the inner cylinder 225 and the outer cylinder 226 are arranged on the vertical axis of the apparatus, the chemical treatment process, the chemical removing process, the rinsing process and the drying process may be carried out while rotating the horizontal wafers' surfaces, in the modification.

Additionally, although the inner chamber 223 is surrounded by the first fixing wall 234, the second fixing wall 238 and the inner cylinder 225, respective inner walls of these elements may be covered with thermal-insulating polymer layers of aluminum oxide and fluorinated resin.

With the above arrangement, if performing the chemical treatment of high temperature in the inner chamber 223, it is possible to prevent the dispersion of heat from the inner cylinder 225 etc. Therefore, in case of repeating the chemical treatment of high temperature, it is facilitated to head the inner chamber 223 again, whereby the heating loss can be reduced.

Figure 22:
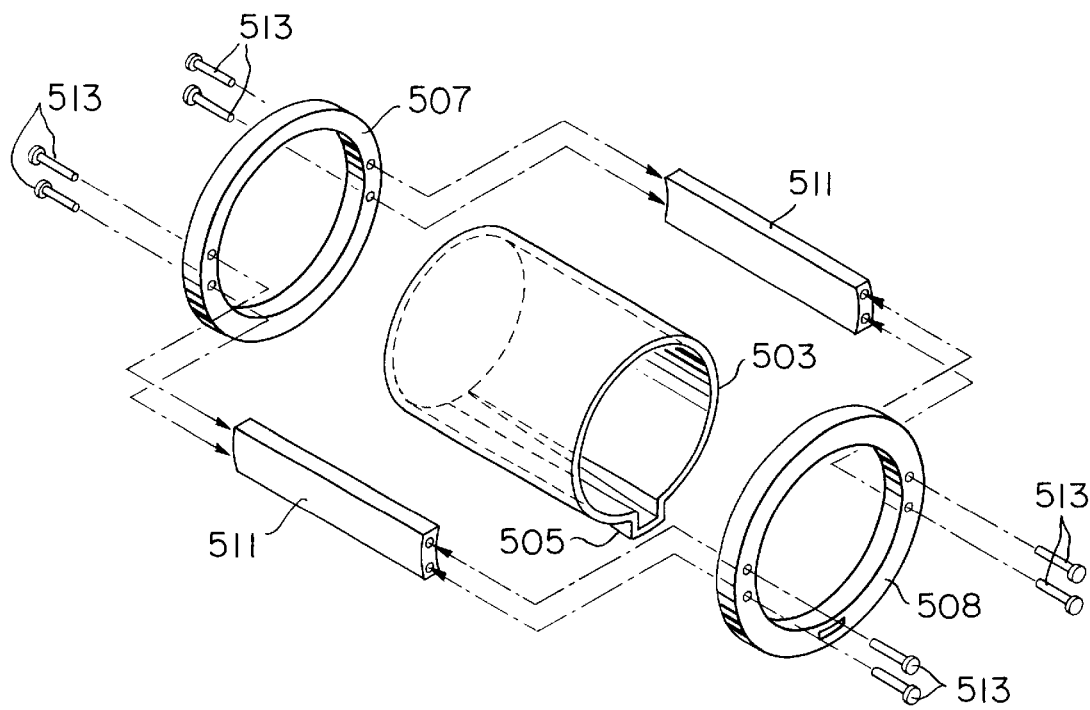
FIG. 22 is a perspective view showing the exploded condition of the cylinder in the other embodiment of the invention.
Figure 23:
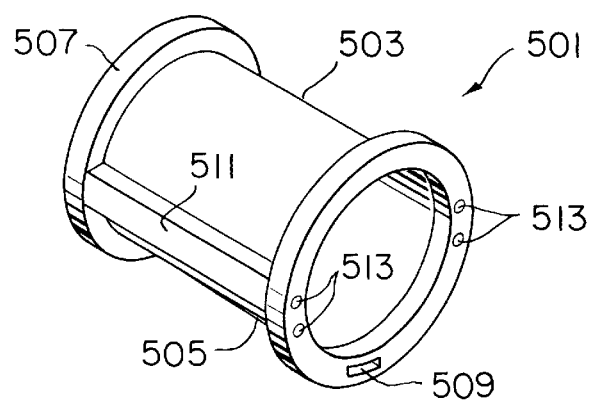
FIG. 23 is a perspective view showing the assembled cylinder of FIG. 22.

Similarly, it is also possible to adopt a cylinder of FIGS. 22 and 23 as the cylinder for reducing the heating loss. FIG. 22 shows the exploded cylinder, while FIG. 23 shows the assembled cylinder. This cylinder 501 includes a cylindrical part 503 made of fluorinated resin, for example, polytetrafluoroethylene, PFA (tetrafluoroethylene perfluoroalkylvinylether copolymer), etc. The cylindrical part 503 is provided, on a bottom thereof, with a drain groove 505 of which depth is gradually increased from its axial side toward the other axial side. Annular reinforcement rings 507, 508 are attached on both axial ends of the cylindrical part 503, respectively. These reinforcement rings 507, 508 are also made of fluorinated resin, for example, polytetrafluoroethylene, PFA, etc. and welded to the cylindrical part 503. The reinforcement ring 508 is provided with a drain port 509 which is connected to the drain groove 505 at the integration with the cylindrical part 503 for draining the treatment liquids. Between the reinforcement rings 507, 508 on both ends of the cylindrical part 505, a pair of reinforcement bars 511 made of stainless steel, aluminum or the like are arranged so as to bridge therebetween. Both ends of each bar 507, 508d are fixed to the rings 507, 508 by means of screws.

Also in the above-mentioned cylinder 501, since the cylindrical part made of polytetrafluoroethylene exhibits such a thermal insulating effect, the it is possible to reduce the heating loss in case of performing the chemical treatment of high temperature again.

Although the processing apparatus of the above-mentioned embodiment includes the inner chamber 223 (first chamber) and outer chamber 224 (second chamber) as the processing space, it may be constituted by three or more processing chambers, for example, similar cylinders to the inner cylinder 225 and the outer cylinder 226.

Figure 24:
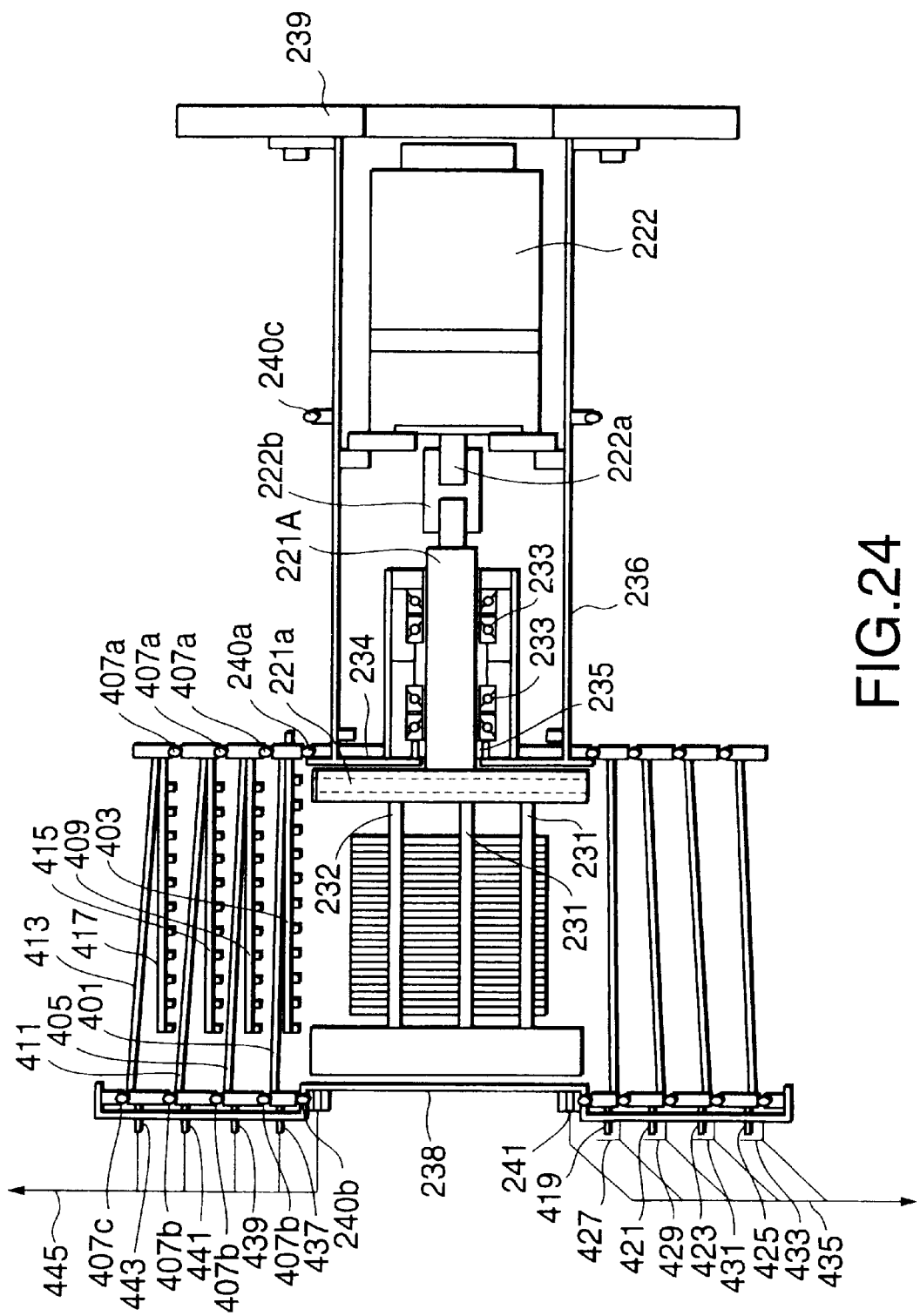
FIG. 24 is a sectional view showing the other embodiment of the invention.

FIG. 24 shows another modification of the processing apparatus of FIG. 13. The apparatus of the modification has cylinders in the form of a fourfold structure while the processing apparatus of FIG. 13 is constructed to have a twofold structure of the inner cylinder 225 and the outer cylinder 226. In the processing apparatus, a first cylinder 401 similar to the inner cylinder 225 of FIG. 13 is arranged so as to cover a space defined between the first fixing wall 234 and the second fixing wall 238. The first cylinder 401 is also configured so as to gradually expand as being apart from the motor 222. Additionally, the first cylinder 401 has both axial ends sealed to the first and second fixing walls 234, 238 through sealing members 240a, 240b in an airtight manner. In the first cylinder 401, a first nozzle 403 is arranged so as to extend from the axial end on the side of the motor 222 in the axial direction. Further, a second cylinder 405 is fitted to the outside of the first cylinder 401. Both axial ends of the second cylinder 405 are sealed to the axial ends of the first cylinder 401 through sealing members 407a, 407b, respectively. Also in the second cylinder 405, a second nozzle 409 is arranged so as to extend from the axial end on the side of the motor 222 in the axial direction. Additionally, a third cylinder 411 is fitted to the outside of the second cylinder 405, while fourth cylinder 413 is fitted to the outside of the third cylinder 411. The respective axial ends of the third and fourth cylinders 411, 413 are sealed to the axial ends of the inside cylinders by the sealing members 407a, 407b. Nozzles 415, 417 are provided in the cylinders 411, 413, respectively.

The second fixing wall 238 is extended outward in the radial direction and also provided, on its outer periphery, with a sealing member 407c which serves to seal between the outer end of the second fixing wall 238 and the periphery of the front end of the fourth cylinder 413.

The first, second, third and fourth cylinders 401, 405, 411, 413 are provided, on their respective lower ends, with first, second, third and fourth drain ports 419, 421, 423, 425, respectively. These drain ports 419, 421, 423, 425 are arranged so as to penetrate the second fixing wall 238 slidably and respectively. The used liquids from the drain ports 419, 421, 423, 425 are received by liquid receivers 427, 429, 431, 433 and further discharged to the outside through a drain pipe 435 collectively.

As to the exhaust gas, the first, second, third and fourth cylinders 401, 405, 411, 413 has first, second, third and fourth exhaust ports 437, 439, 441, 443 formed on their respective upper ends, respectively. These exhaust ports 437, 439, 441, 443 are arranged so as to penetrate the second fixing wall 238 slidably and respectively. The exhaust gas is discharged from respective tips of the ports 437, 439, 441, 443 through an exhaust pipe 445.

In order to allow the above-constructed processing apparatus to perform the chemical treatment process, the IPA process, the pure wafer process and the drying process, first of all, the wafer W are carried by the fixing rods 231 and the pusher rods 232. Then, while rotating the so-carried wafers W, the chemical for cleaning is ejected from the first nozzle 403 in the first cylinder 401. Next, it is executed to retreat the first cylinder 401 to the side of the motor 222 and supply the chemical IPA from the second nozzle 409 in the second cylinder 405 for the IPA cleaning. After completing the IPA cleaning, the second cylinder 405 is withdrawn and the pure water for cleaning is ejected from the third nozzle 415 in the third cylinder 411. After that, the third cylinder 411 is moved backward and then, any dry gas, for example, $N_2$ gas is fed through the fourth nozzle 417 in the fourth cylinder 413 to dry the wafers W. In the above processes, the used liquids are drained through the first to fourth drain ports 419, 421, 423, 425, while the exhaust gas is discharged from the first to fourth exhaust ports 437, 439, 441,443.

In this way, according to the processing apparatus of the embodiment, the respective processes, i.e., the chemical treatment process, the IPA process, the pure water process and the drying process can be respectively and separately performed in the different cylinders without moving the wafers W. Accordingly, it is possible to perform the whole cleaning process effectively and further prevent the mixing of cleaning mediums, in other words, the occurrence of cross-contamination.

Of course, the above-mentioned apparatus is applicable to other processes besides the chemical treatment process, the IPA process, the pure water process and the drying process.

Again in the above apparatus, the chemical nozzle 251 (also operating as an IPA nozzle) is positioned in the inner cylinder 225 while the pure-water nozzle 271 and the dry gas nozzle 281 are attached to the second fixing wall 238 between the inner cylinder 225 and the outer cylinder 226. As the modification, it is also possible to adopt another arrangement where the chemical nozzle 251 (also operating as an IPA nozzle) is attached to the second fixing wall 238 outside the inner cylinder 225 and the outer cylinder 226, while the pure-water nozzle 271 and the dry gas nozzle 281 are positioned in the outer cylinder 226. Alternatively, the chemical nozzle 251 (also operating as an IPA nozzle), the pure-water nozzle 271 and the dry gas nozzle 281 may be arranged in the inner cylinder 225 and the outer cylinder 226.

In the above-mentioned embodiment, the chemical process and sequent chemical removing process are executed in the inner chamber 233 (first processing chamber), while the rinsing process and drying process are executed in the outer chamber (second processing chamber). However, the processing method of the invention is not limited to such a processing method as mentioned above. For example, it is also possible to perform the chemical treatment using different kinds of chemicals in both of the inner chamber 223 (first processing chamber) and the outer chamber 224 (second processing chamber). In this way, by respectively processing the wafers in different chambers, that is, the inner chamber 223 (first processing chamber) and the outer chamber 224 (second processing chamber) while using different kinds of chemicals, it is possible to prevent the occurrence of cross-contamination derived from the undesirable mixing of chemicals of different kinds.

Note, the above-mentioned embodiment is directed to the case of processing the maximum number of wafers W in the rotor 221. Nevertheless, if necessary, the processing apparatus can perform the cleaning/drying of less wafers than the maximum number of wafers that the rotor 221 does accommodate, even a single wafer as the case may be.

Additionally, although the present invention is applied on the cleaning/drying apparatus for semiconductor wafers in the above-mentioned embodiments, the present invention is applicable to other kinds of substrates besides the semiconductor wafers, for example, LCD glass substrates etc. as a matter of course.

As mentioned above, according to the present invention, owing to the provision of the processing chambers of the plural number and the moving means for moving at least one of the chambers to the periphery of the substrates, it is possible to move different chambers to the periphery of the substrates corresponding to the kinds of processing liquids when applying the designated treatment on the substrates while using a plurality of processing fluids. Thus, even if the respective processing liquids are remained in the respective chambers, the change of chambers would make it possible to prevent the different liquid from being mixed in the identical chamber.

Further, according to the invention, the plural processing chambers include the first processing chamber and the second processing chamber and therefore, the moving means moves at least either one of the first and second chambers. Therefore, the following processes can be carried out in order: to accommodate the substrates in the first processing chamber; to supply the processing fluid into the first processing chamber for the first designated; to move the second processing chamber thereby allowing the second processing chamber to enter the first processing chamber so that the substrates are accommodated in the second processing chamber; and to supply the processing fluid into the second processing chamber for the second designated treatment.

The moving means of the invention is constructed so as to allow the plural processing chambers to move to the periphery of the wafers in accordance with the kinds of processing fluids on use. For example, in the treatment to use an acid processing fluid and an alkaline processing fluid for the treatment on the substrates, the different processing chambers are moved to the periphery of the substrates in both cases of supplying the acid fluid and the alkaline fluid. Consequently, even if the processing fluids are remained in the chambers, there is no possibility of occurrence of the reaction of the acid fluid and the alkaline fluid, preventing the occurrence of cross-contamination, such as salts.

Further, according to the invention, the processing gas may be supplied to at least one of the plural processing chambers. In this case, for example, inert gas (e.g. N2 gas), organic vapor like IPA vapor, mixture of N2 gas and IPA vapor, etc. may be used as the processing gas. If N2 gas is supplied into the processing chamber, then it is possible to attain the treatment under the inert atmosphere. Alternatively, the supply of IPA vapor or mixture of N2 gas and IPA vapor would promote to dry the processing thereby to prevent the occurrence of watermarks at the drying, for example.

Since the processing apparatus of the invention includes the rotatable carrying means for carrying the plural objects to be processed, the drive means for rotating the carrying means, the plural processing chambers capable of surrounding the objects carried by the carrying means and the processing fluid supplying means for supplying the processing fluid to the objects, it is possible to rotate the plural objects carried by the carrying means while supplying the processing fluids into the plural processing chambers. Accordingly, it is possible to prevent the objects from being contaminated due to the reaction of different fluids. In connection, it is preferable to construct each processing chamber capable of surrounding the objects in a sealed manner. Then, it is possible to prevent the objects from contacting with the outside atmosphere, whereby the contamination of the objects can be further avoided certainly.

According to the invention, since the carrying means carries the objects so as to arrange their surfaces vertically and is capable of rotating about the horizontal axis, it is possible to remove the processing liquid sticking to the objects with ease.

According to the invention, since the apparatus is further equipped with the moving means for moving at least one of the plural processing chambers to the objects relatively, it is possible to reduce the number of times to transfer the objects from one position to the other position during the whole process, decreasing the damage on the objects, etc.

According to the invention, since the drive means is provided with the cooling means for restricting its own overheating, it is possible to prevent the operational efficiency of the drive means from being deteriorated by its thermal fatigue caused by the overheating. Thus, it is also possible to improve the efficiency and lifetime of the drive means, that is, the improvement of reliability and lifetime of the apparatus can be realized.

According to the invention, since the processing chamber is formed so as to separate the interior atmosphere from the exterior atmosphere in even its condition to surround no objects to be processed, it is possible to prevent the interior atmosphere from leaking out at the apparatus' inactivated condition of the apparatus. Thus, the contamination for the exterior atmosphere can be prevented to ensure the safety of an operator.

According to the invention, since at least one processing chamber of the plural chambers is formed so as to have the interior atmosphere separable from the interior atmospheres of the other chambers, it is possible to prevent the occurrence of cross-contamination resulting from the reaction of different processing fluids because of no mutual mixing of the respective interior atmospheres of the chambers.

According to the invention, since at least one processing chamber of the plural chambers is movably constructed so as to allow to surround the other chambers, it is possible to reduce the installation space of the chambers, accomplishing the miniaturization of the apparatus.

According to the invention, the processing fluid supplying means includes the fluid supplying nozzles capable of supplying at least one of the chemical, the solvent of chemical, the rinsing liquid and the drying fluid wherein one or more fluid supplying nozzles are arranged in each processing chamber. Accordingly, as the common nozzle can supply the plural processing fluids, it is possible to reduce the number of nozzles and miniaturize the processing chambers, and also the whole processing apparatus.

Further, according to the invention, the fluid treatment process includes at least one step of supplying the chemical liquid, while the drying process includes at least one step of supplying the drying fluid. Additionally, after the chemical liquid supplying step, it is executed to supply the solvent for the chemical to the objects in order to remove the chemical from the objects. Therefore, with the application of drying process on the objects, it is possible to bring the objects into their cleaned condition, accompanying the improvement of the yield of productivity. In this case, since the chemical removing process after the completion of the chemical treatment process allows the residual chemical on the objects or the same in the processing chamber to be removed certainly, it is possible to improve the processing efficiency furthermore. In addition, it is possible to prevent the corrosion of the processing chamber due to the chemicals.

According to the invention, the drying fluid is supplied into the outer processing chamber to dry the objects contained therein together. Therefore, even if the processing liquid supplied into the inner processing chamber falls off the objects, it is possible to prevent the leakage of the processing liquid to the outside of the apparatus owing to the receipt of the outer chamber, avoiding the contamination against the outside atmosphere. In this case, when the drying fluid is supplied into the outer processing chamber to dry the objects contained therein together, it is possible to dry the outer processing chamber with the evaporation of the processing liquid perfectly.

What is claimed is:

1. A processing apparatus comprising a plurality of containers independently movably arranged so as to occupy both a surrounding position to surround an object to be processed and a stand-by position not to surround the object, wherein one of the plurality of containers is positionable in the surrounding position in order to subject the object to one process, and another of the plurality of containers is positionable in the surrounding position in order to subject the object to a different process.

2. A processing apparatus as claimed in claim 1, wherein each of the containers is provided, at an interior thereof, with a processing fluid supplying port which can supply a processing fluid for applying a process on the object.

3. A processing apparatus as claimed in claim 2, wherein each of the containers is provided with a discharge port for discharging the processing fluid provided for processing the object, respective profiles of the containers being tapered in a manner that their local diameters gradually decrease while leaving the discharging port.

4. A processing apparatus as claimed in claim 2, wherein the containers are capable of surrounding the object so as to be sealed in the containers.

5. A processing apparatus as claimed in claim 2, wherein the containers are capable of insulating their inside atmospheres from their outside atmospheres even when the containers are in the stand-by position.

6. A processing apparatus as claimed in claim 2, wherein an atmosphere inside at least one container of the containers is capable of being insulated from an atmosphere inside another container of the containers.

7. A processing apparatus as claimed in claim 2, wherein each of the containers is provided with a discharge port for discharging the processing fluid provided for processing the object, respective profiles of the containers being tapered in a manner that their local diameters gradually decrease as leaving the discharging port, the holder being provided with a driving unit for rotating the object, the object being held in the holder so that the object's surface is along an up and down direction and the object is rotated so that a rotating axis extends in the horizontal direction of the processing apparatus.

8. A processing apparatus comprising a holder for holding an object to be processed and a plurality of containers movably arranged so as to occupy both a surrounding position to surround the object and a stand-by position not to surround the object, wherein the plurality of containers are arranged while engaging each other and also adapted so as to be individually movable to the object, and wherein when a designated container of the plurality of containers is positioned in the surrounding position, the object is processed in the designated container, the other container inside the designated container being positioned in the stand-by position.

9. A processing apparatus as claimed in claim 8, wherein the holder is provided with a driving unit for rotating the object.

10. A processing apparatus as claimed in claim 9, wherein the object is held in the holder so that the object's surface is along an up and down direction and the object is rotated so that a rotating axis extends in the horizontal direction of the processing apparatus.

11. A processing apparatus as claimed in claim 9, wherein the plurality of objects are juxtaposed along the rotating axis, the processing fluid supplying port having nozzle orifices whose number is equal to or larger than the number of the objects.

12. A processing apparatus as claimed in claim 2, wherein each of the containers is provided, at an interior thereof, with a processing fluid supplying port which can supply a processing fluid for applying a process on the object, each of the containers is provided with a discharge port for discharging the processing fluid provided for processing the object, respective profiles of the containers being tapered in a manner that their local diameters gradually decrease as leaving the discharging port, the holder being provided with a driving unit for rotating the object, the object being held in the holder so that the object's surface is along an up and down direction and the object is rotated so that a rotating axis extends in the horizontal direction of the processing apparatus.

13. A processing apparatus as claimed in claim 12, wherein the containers are capable of surrounding the object so as to be sealed in the containers.

14. A processing apparatus comprising:
a pair of first and second walls arranged so as to oppose each other and also be separated from each other;
a holder for holding the object between the first wall and the second wall; and
a plurality of peripheral walls each extending from the first wall to the second wall thereby to define a processing space for processing the object together with the first and second walls;
wherein the plurality of peripheral walls are overlapped while being mutually inserted in each other and are individually adapted so as to be movable between a surrounding position to define the processing space together with the first and second walls, and a stand-by position where no object is surrounded, the object being processed in a condition where a designated peripheral wall of the plurality of peripheral walls is positioned in the surrounding position while positioning the other peripheral wall inside the designated peripheral wall in the stand-by position.

15. A processing apparatus as claimed in claim 14, wherein one of the peripheral walls is in the form of cylinder.

16. A processing apparatus as claimed in claim 14, wherein the peripheral walls are adapted so as to be movable between the surrounding position and the stand-by position in a direction between the first wall and the second wall.

17. A processing apparatus as claimed in claim 14, wherein the second wall is positioned above the first wall and the peripheral walls are arranged so that their axes extend up and down.

18. A processing apparatus as claimed in claim 17, wherein the peripheral walls and the first wall are constructed so as to allow liquid to be stored in a space defined by the peripheral walls and the first wall.

19. A processing apparatus as claimed in claim 17, wherein the second wall is provided with a lid which can open and close in order to load the objects into the processing apparatus and unload the object therefrom.

20. A processing apparatus comprising a plurality of containers movably arranged so as to occupy both a surrounding position to surround an object to be processed and a stand-by position not to surround the object, wherein one of the plurality of containers is positioned in the surrounding position, then the object being processed, and wherein each of the containers is provided, at an interior thereof, with a processing fluid supplying port which can supply a processing fluid for applying a process on the object.

21. A processing apparatus as claimed in claim 20, wherein the processing fluid is either liquid or gas.

22. A processing apparatus as claimed in claim 20, wherein each of the containers is provided with a discharge port for discharging the processing fluid provided for processing the object, respective profiles of the containers being tapered in a manner that their local diameters gradually decrease while leaving the discharging port.

23. A processing apparatus as claimed in claim 20, wherein the containers are capable of surrounding the object so as to be sealed in the containers.

24. A processing apparatus as claimed in claim 20, wherein the containers are capable of insulating their inside atmospheres from their outside atmospheres even when the containers are in the stand-by position.

25. A processing apparatus as claimed in claim 20, wherein an atmosphere inside at least one container of the containers is capable of being insulated from an atmosphere inside another container of the containers.

26. A processing apparatus comprising a plurality of containers movably arranged so as to occupy both a surrounding position to surround an object to be processed and a stand-by position not to surround the object, wherein one of the plurality of containers is positioned in the surrounding position, then the object being processed, and wherein each of the containers is provided with a discharge port for discharging the processing fluid provided for processing the object.

27. A processing apparatus as claimed in claim 26, wherein respective profiles of the containers are tapered in a manner that their local diameters gradually decrease as leaving the discharging port.

28. A processing apparatus comprising a plurality of containers movably arranged so as to occupy both a surrounding position to surround an object to be processed and a stand-by position not to surround the object, wherein one of the plurality of containers is positioned in the surrounding position, then the object being processed, and wherein the containers are capable of surrounding the object so as to be sealed in the containers.

29. A processing apparatus comprising a plurality of containers movably arranged so as to occupy both a surrounding position to surround an object to be processed and a stand-by position not to surround the object, wherein one of the plurality of containers is positioned in the surrounding position, then the object being processed, and wherein the containers are capable of insulating their inside atmospheres from their outside atmospheres even when the containers are in the stand-by position.

30. A processing apparatus comprising a plurality of containers movably arranged so as to occupy both a surrounding position to surround an object to be processed and a stand-by position not to surround the object, wherein one of the plurality of containers is positioned in the surrounding position, then the object being processed, and wherein an atmosphere inside at least one container of the containers is capable of being insulated from an atmosphere inside the other container of the containers.

\* \* \* \* \*